United States Patent
Hayashi et al.

(10) Patent No.: US 8,399,962 B2
(45) Date of Patent: Mar. 19, 2013

(54) SEMICONDUCTOR CHIP AND PROCESS FOR PRODUCTION THEREOF

(75) Inventors: Masashi Hayashi, Osaka (JP); Masao Uchida, Osaka (JP); Kunimasa Takahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/389,708

(22) PCT Filed: May 13, 2011

(86) PCT No.: PCT/JP2011/002684
§ 371 (c)(1),
(2), (4) Date: Feb. 9, 2012

(87) PCT Pub. No.: WO2011/145309
PCT Pub. Date: Nov. 24, 2011

(65) Prior Publication Data
US 2012/0138951 A1    Jun. 7, 2012

(30) Foreign Application Priority Data
May 18, 2010    (JP) .................................. 2010-114404

(51) Int. Cl.
*H01L 29/06*    (2006.01)
(52) U.S. Cl. ..................... 257/618; 257/620; 438/460
(58) Field of Classification Search .................. 257/618, 257/620, 627, 77, 615, E21.599; 438/460
See application file for complete search history.

(56) References Cited

U.S. PATENT DOCUMENTS

| 6,072,197 A | 6/2000 | Horino et al. |
|---|---|---|
| 2002/0063258 A1 | 5/2002 | Motoki |
| 2009/0057847 A1 | 3/2009 | Nakayama |
| 2009/0101936 A1 | 4/2009 | Kamei et al. |
| 2009/0114910 A1 | 5/2009 | Chang |
| 2009/0127564 A1 | 5/2009 | Irikura et al. |
| 2009/0283760 A1 | 11/2009 | Fujii |
| 2010/0219419 A1 | 9/2010 | Hata et al. |
| 2010/0244063 A1 | 9/2010 | Yokogawa et al. |
| 2012/0138951 A1* | 6/2012 | Hayashi et al. .................. 257/76 |

FOREIGN PATENT DOCUMENTS

| JP | 02-275614 A | 11/1990 |
|---|---|---|
| JP | 07-188927 A | 7/1995 |
| JP | 10-135576 A | 5/1998 |
| JP | 11-340576 A | 12/1999 |
| JP | 2002-124473 A | 4/2002 |

(Continued)

OTHER PUBLICATIONS

Co-pending U.S. Appl. No. 13/579,432, filed Aug. 16, 2012.

(Continued)

*Primary Examiner* — Mark Prenty
(74) *Attorney, Agent, or Firm* — Renner, Otto, Boisselle & Sklar, LLP

(57) ABSTRACT

A semiconductor chip of the present invention is a semiconductor device that includes a hexagonal semiconductor layer having anisotropic mechanical properties. A semiconductor chip (21), when viewed from a direction perpendicular to the semiconductor chip (21), has a rectangular shape that has a first side (1A) and a second side (1B) orthogonal to the first side (1A). The amount of thermal deformation along a direction in which the first side (1A) extends and the amount of thermal deformation along a direction in which the second side (1B) extends are substantially equal to each other.

27 Claims, 15 Drawing Sheets

FOREIGN PATENT DOCUMENTS

| | | | |
|---|---|---|---|
| JP | 2002-170992 | A | 6/2002 |
| JP | 2004-014709 | A | 1/2004 |
| JP | 2004-128521 | A | 4/2004 |
| JP | 2005-332892 | A | 12/2005 |
| JP | 2007-059552 | A | 3/2007 |
| JP | 2007-073700 | | 3/2007 |
| JP | 2007-081096 | A | 3/2007 |
| JP | 2007-103585 | A | 4/2007 |
| JP | 2008-066717 | A | 3/2008 |
| JP | 2008-227205 | A | 9/2008 |
| JP | 2008-282942 | A | 11/2008 |
| JP | 2009-126727 | A | 6/2009 |
| WO | 2007/010645 | A1 | 1/2007 |
| WO | 2010/029720 | A1 | 3/2010 |

OTHER PUBLICATIONS

International Search Report for related International Application No. PCT/JP2011/002685 mailed Aug. 23, 2011.

International Preliminary Report on Patentability (PCT/IPEA/416/409) for related International Application No. PCT/JP2011/002685 dated Apr. 10, 2012 (with partial English translation).

Notice of Reasons for Rejection issued on Jul. 6, 2012 and a partial English translation for Japanese Patent Application No. 2012-515742, which is a national phase application of PCT/JP2011/002685.

International Search Report for corresponding International Application No. PCT/JP2011/002684 mailed Aug. 16, 2011.

Li et al., "Thermal Expansion and Thermal Expansion Anisotrophy of SiC Polytypes", Journal of the American Ceramic Society, vol., 70, No. 7, pp. 445-448 (1987).

Hadis Morkoc, "Handbook of Nitride Semiconductors and Devices", vol. I, p. 17, 2008.

Co-pending International Application No. PCT/JP2011/002685 filed May 13, 2011 (WO 2011/145310).

* cited by examiner (a)

(b)

(a)

(b)

(a)

(b)

(a)

(b)

(a)

(b)

SEMICONDUCTOR CHIP AND PROCESS FOR PRODUCTION THEREOF

TECHNICAL FIELD

The present invention relates to a semiconductor chip and a method of manufacturing the semiconductor chip. More particularly, the present invention relates to a device using a hexagonal semiconductor that has anisotropic mechanical properties, such as silicon carbide or gallium nitride.

BACKGROUND ART

The mainstream semiconductor devices have conventionally been ones that use a silicon (Si) substrate. In recent years, hexagonal semiconductor materials such as silicon carbide (SiC) and gallium nitride (GaN) are attracting attention in the field of power semiconductor devices, and are being developed.

Power semiconductor devices are semiconductor elements for uses in which a large amount of current flows at a high voltage, and are required to be low in loss. For instance, silicon carbide (SiC) and gallium nitride (GaN), which are materials whose dielectric breakdown voltage itself is higher than that of silicon (Si) by approximately one digit, have a feature that the reverse breakdown voltage is maintained even when a depletion layer is thin in a p-n junction portion or a Schottky junction portion. Using SiC or GaN therefore enables manufacturing a thin device and raising the doping concentration. A power semiconductor device low in on-resistance, high in breakdown voltage, and low in loss is consequently formed. SiC and GaN are also steadier in high temperature operation than Si. Great expectations are put on the use of SiC, GaN, and other hexagonal semiconductor materials which have these characteristics.

CITATION LIST

Patent Literature

Patent Document No. 1: Japanese Patent Application Laid-Open Publication No. 2007-81096
Patent Document No. 2: Japanese Patent Application Laid-Open Publication No. 7-188927

Non-Patent Literature

Non Patent Document No. 1: Z. Li et al., J. Am. Ceram. Soc., 70 [7] 445-48 (1987)
Non Patent Document No. 2: H. Morkoc, Handbook of Nitride Semiconductors and Devices, Vol. I, p. 17

SUMMARY OF INVENTION

Technical Problem

The inventors of the present invention have found out that, when a conventional SiC device is packaged, a difference in mechanical properties from Si can create adverse effects. Results of the study conducted by the inventors are described below.

FIG. 19 is a diagram schematically illustrating the planar structure of a semiconductor device formed on a semiconductor wafer 103. As illustrated in FIG. 19, a plurality of semiconductor devices 101 are disposed on the semiconductor wafer 103. Each of the semiconductor devices 101 measures a few mm square. On the semiconductor wafer 103, a cutting margin area with a width of, for example, approximately 50 µm is provided between one semiconductor device 101 and another. The cutting margin areas are provided with cutting lines 102a and 102b. Cutting the semiconductor wafer 103 along the cutting lines 102a and 102b separates the semiconductor devices 101 from one another and turns the semiconductor devices 101 into semiconductor chips. When there are no limitations on shape, each semiconductor device 101 normally has a first side 101a and a second side 101b that are substantially equal to each other, and has a square shape in plan view.

The inventors of the present invention used a 4H—SiC substrate as the semiconductor wafer 103 to manufacture a 3.6-mm square semiconductor chip of a metal-insulator-semiconductor field effect transistor (hereinafter, abbreviated as MISFET) type. Package assembly was performed on this semiconductor chip under package assembly conditions A, B, and C. The package assembly conditions A, B, and C are conditions that ensure that a MISFET semiconductor chip using Si has satisfactory reliability. The package assembly here includes steps of electrically connecting and fixing the semiconductor chip to a metal lead frame with solder or the like, forming an aluminum wire or the like as electrical wiring necessary for the lead frame and the semiconductor chip, and sealing the semiconductor chip which has an insulating protective film with an epoxy-based resin material. In some cases, a polyimide-based material called junction coating resin (JCR) is applied before the semiconductor chip is sealed with resin.

A temperature cycle test was performed on the semiconductor chips assembled into packages, under the same conditions that are used in an Si device reliability assessment test (lower limit: −65° C./upper limit: 150° C.) Results of this temperature cycle test are shown in FIG. 20. A 300-cycle test normally causes substantially no failures in Si devices assembled under the package assembly conditions A, B, and C. In the case of semiconductor chips that use 4H—SiC, on the other hand, as shown in FIG. 20, slightly less than 20% of defects are found at 100 cycles in the chip of the package assembly condition A, and defects begin to be generated after around 100 cycles in the chip of the package assembly conditions B as well.

In the results of FIG. 20, no failures are found in the chip of the package assembly condition C. However, an examination of the semiconductor chips upon opening the packages confirmed, in addition to a semiconductor chip crack, a crack in the passivation film formed from silicon nitride (the insulating thin film) and the deformation of an aluminum electrode electrically connected to a source electrode of the MISFET, under the package assembly conditions A, B, and C. It is understood from these results that assembly conditions proven effective for Si devices from the past performance cannot be applied to SiC devices as they are.

The inventors of the present invention have thought that the cracks and the electrode deformation which are generated in assembling the package of an SiC device are caused by the crystal structure of SiC and the resultant mechanical properties. Si, which is a cubic crystal structure, exhibits isotropic mechanical properties in which the crystal orientation does not cause anisotropy. SiC and GaN, on the other hand, are hexagonal crystal structures and exhibit anisotropic mechanical properties. For example, Non-patent Document No. 1 describes the linear expansion coefficient of SiC and shows that the value of the linear expansion coefficient varies depending on the crystal orientation. Non-patent Document No. 2 describes the linear expansion coefficient of GaN.

Patent Document No. 1 discloses the anisotropy of the heat conductivity of SiC due to crystal plane orientation.

Patent Document No. 2 discloses a method of forming a heat-resistant ceramic material by performing heat treatment at a temperature equal to or higher than the recrystallization temperature after a CVD free-standing film structure is grown from SiC or the like. This heat treatment makes the alignment of crystal grains random and suppresses the anisotropy of the mechanical strength. Generally speaking, however, the mobility of carriers in crystals drops greatly when the alignment of crystal grains is random. It will therefore be difficult to apply the method of Patent Document No. 2 without modification to the manufacture of SiC as a semiconductor device.

A device using SiC or GaN operates more steadily in a high-temperature environment than a device using Si, and is therefore designed for uses of a wider temperature range than in the case of a device using Si. When the range of temperature at which a device is to be used is wider, thermal deformation and the effect of stress due to a temperature difference ($\Delta T$) in the use environment are more pronounced. It is therefore very important to uniformize thermal deformation and strain due to the temperature difference ($\Delta T$) in the use environment and reduce stress in order to improve the reliability of a semiconductor device that uses SiC, GaN, or the like.

The present invention has been made in view of the problems described above, and a main object of the present invention is to provide a semiconductor chip using a hexagonal semiconductor that accomplishes high reliability by reducing cracks, electrode deformation, and others caused by thermal deformation of the semiconductor chip and stress which are due to a temperature difference in the use environment, and also to provide a method of manufacturing the semiconductor chip.

Solution to Problem

According to the present invention, there is provided a semiconductor chip including a hexagonal semiconductor layer, in which, when viewed from a direction perpendicular to the semiconductor layer, the semiconductor layer has a rectangular shape which includes a first side and a second side substantially orthogonal to the first side and different from the first side in linear expansion coefficient, and an amount of thermal deformation in a direction in which the first side extends and an amount of thermal deformation in a direction in which the second side extends are substantially equal to each other.

According to an embodiment, a semiconductor chip further includes an insulating film which is provided so as to cover at least a part of a principal surface of the semiconductor layer and which has isotropic mechanical properties.

According to an embodiment, a semiconductor chip further includes a metal film which has isotropic mechanical properties.

According to an embodiment, the metal film includes aluminum, copper, or an alloy of aluminum or copper.

According to an embodiment, the semiconductor layer includes silicon carbide.

According to an embodiment, the semiconductor layer includes gallium nitride.

According to an embodiment, the principal surface of the semiconductor layer is tilted from a (0001) plane by −10° or more and 10° or less.

According to an embodiment, the semiconductor layer is a layer formed, on a principal surface of a single-crystal substrate, from the same material as a material of the single-crystal substrate.

According to an embodiment, an expression of $0.8 \leq \Delta Lx/\Delta Ly \leq 1.2$ is established, where Lx represents a length of the first side, Ly represents a length of the second side, $\Delta Lx$ represents a thermal deformation amount along the direction in which the first side extends, and $\Delta Ly$ represents a thermal deformation amount along the direction in which the second side extends.

According to an embodiment, the direction in which the first side extends and a <11-20> direction form an angle that is less than 15°, and the first side is longer than the second side.

According to an embodiment, a linear expansion coefficient along the direction in which the first side extends is smaller than a linear expansion coefficient along the direction in which the second side extends, and the first side is longer than the second side.

According to an embodiment, an expression of $1.05 \leq Lx/Ly \leq 1.6$ is established, where Lx represents a length of the first side and Ly represents a length of the second side.

According to an embodiment, the semiconductor layer includes silicon carbide, and an expression of $1.1 \leq Lx/Ly \leq 1.6$ is established, where Lx represents a length of the first side and Ly represents a length of the second side.

According to an embodiment, the semiconductor layer includes gallium nitride, and an expression of $1.05 \leq Lx/Ly \leq 1.2$ is established, where Lx represents a length of the first side and Ly represents a length of the second side.

According to an embodiment, the insulating film is formed from an insulator including silicon nitride.

According to an embodiment, the insulating film has a thickness of 1.5 μm or more and 5 μm or less.

According to an embodiment, the semiconductor layer is a part of one element selected from the group consisting of a p-n junction diode, a Schottky barrier diode, a metal-insulator-semiconductor field effect transistor, a metal-semiconductor field effect transistor, and a junction field effect transistor.

A semiconductor device according to the present invention includes: the semiconductor chip of the present invention; and a resin which covers at least a part of the semiconductor chip.

According to the present invention, there is provided a method of manufacturing a semiconductor chip including a hexagonal semiconductor layer, the method including: a step (a) of forming a semiconductor device on a wafer that contains the semiconductor layer; and a step (b) of forming the semiconductor chip including the semiconductor device by cutting the wafer in a first direction and a second direction, in which the step (b) includes determining a length of the first direction and a length of the second direction so that an amount of thermal deformation along a direction in which the first side of the semiconductor chip extends becomes substantially equal to an amount of thermal deformation along a direction in which the second side of the semiconductor chip extends.

Advantageous Effects of Invention

According to the present invention, a hexagonal semiconductor layer having anisotropic mechanical properties is deformed from heat such that the amount of thermal deformation along a direction in which a first side extends and the amount of thermal deformation along a direction in which a second side extends are substantially equal to each other, thereby making a difference in stress applied to the four corners of the semiconductor layer smaller than in prior art. This reduces cracks, electrode deformation, and the like in a semiconductor chip and a protective film on the semiconductor chip. The resultant semiconductor chip therefore has high reliability.

DESCRIPTION OF EMBODIMENTS

A semiconductor chip according to an embodiment of the present invention is described below with reference to the drawings. Throughout the drawings, components that have substantially the same function are denoted by the same reference symbol to simplify the description. The present invention is not limited to the following embodiment.

Figure 1:
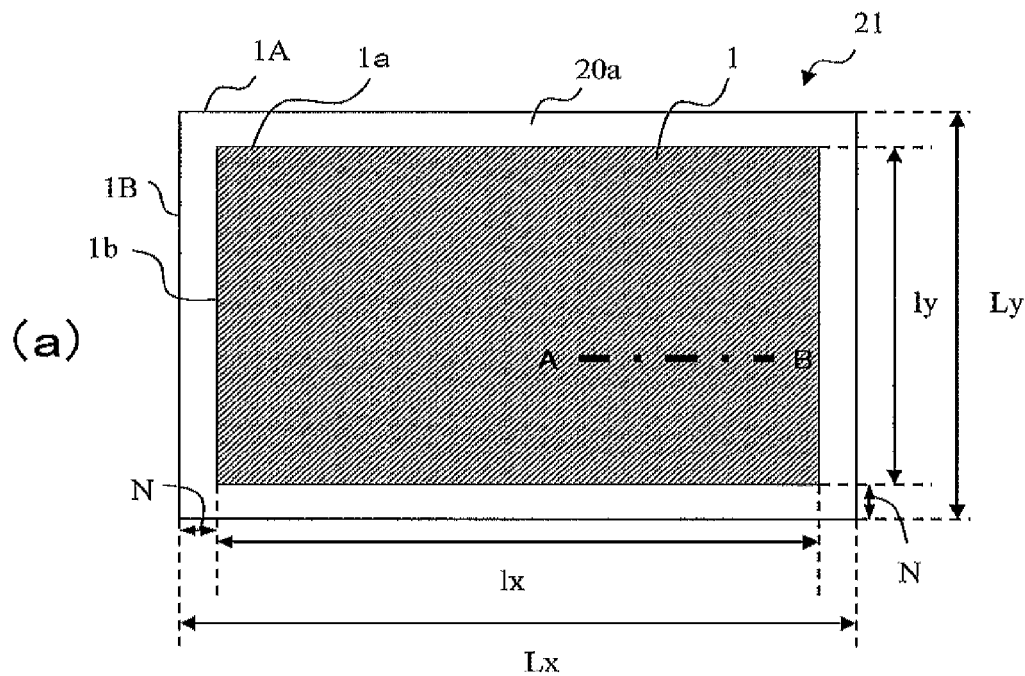
FIGS. 1(a) and 1(b) are plan views schematically illustrating the structure of a semiconductor device 1 and a semiconductor chip 21 according to an embodiment.
Figure 1:
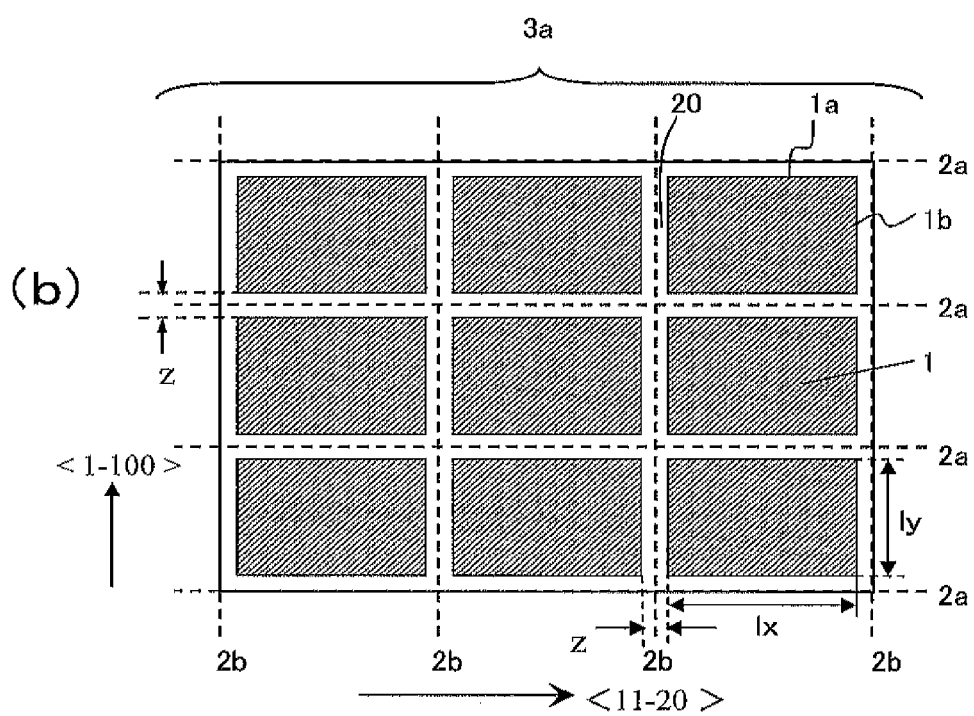

FIG. 1(a) is a plan view illustrating a semiconductor chip 21 of this embodiment. The semiconductor chip 21 has, when viewed from a direction perpendicular to the top face of the semiconductor chip 21, a rectangular shape that has first sides 1A and second sides 1B substantially orthogonal to the first sides 1A. The semiconductor chip 21 includes a semiconductor layer such as an SiC layer, an insulating film formed on the semiconductor layer, and a metal layer such as an electrode. The semiconductor layer has a hexagonal structure which has anisotropic mechanical properties, whereas the insulating film and the metal layer have isotropic mechanical properties. The first sides 1A and second sides 1B of the semiconductor chip 21 (the outer shape viewed from a direction perpendicular to the top face of the semiconductor chip 21) correspond respectively to first sides and second sides of the semiconductor layer. An angle formed by one first side 1A and one second side 1B may deviate from 90° in the process of manufacturing the semiconductor chip despite the first sides 1A and the second sides 1B being designed to be orthogonal to each other. A preferred angle between one first side 1A and one second side 1B is 85° to 95°.

In the semiconductor chip 21, the amount of thermal deformation along a direction in which the first sides 1A extend and the amount of thermal deformation along a direction in which the second sides 1B extend are substantially equal to each other. The thermal deformation amount along the first sides 1A and the thermal deformation amount along the second sides 1B in this embodiment are, for example, the amounts of deformation measured when the temperature is varied from room temperature (25° C.) to 150° C.±5° C.

Specifically, because the linear expansion coefficient along the direction in which the first sides 1A extend and the linear expansion coefficient along the direction in which the second sides 1B extend differ from each other, the thermal deformation amount along the direction in which the first sides 1A extend and the thermal deformation amount along the direction in which the second sides 1B extend can be made close to each other by adjusting the length of each first side 1A and the length of each second side 1B.

The first sides 1A may extend in a <11-20> direction or a direction tilted from <11-20>. In the case where the first sides 1A extend in a direction tilted from <11-20>, an angle formed by the direction in which the first sides 1A extend and the <11-20> direction is less than 15°. When the angle between one first side 1A and the <11-20> direction is given as θ, θ satisfies the following angle condition:

$$60n-15<\theta<60n+15 \; (n=0, 1 \ldots 5)$$

Figure 2:
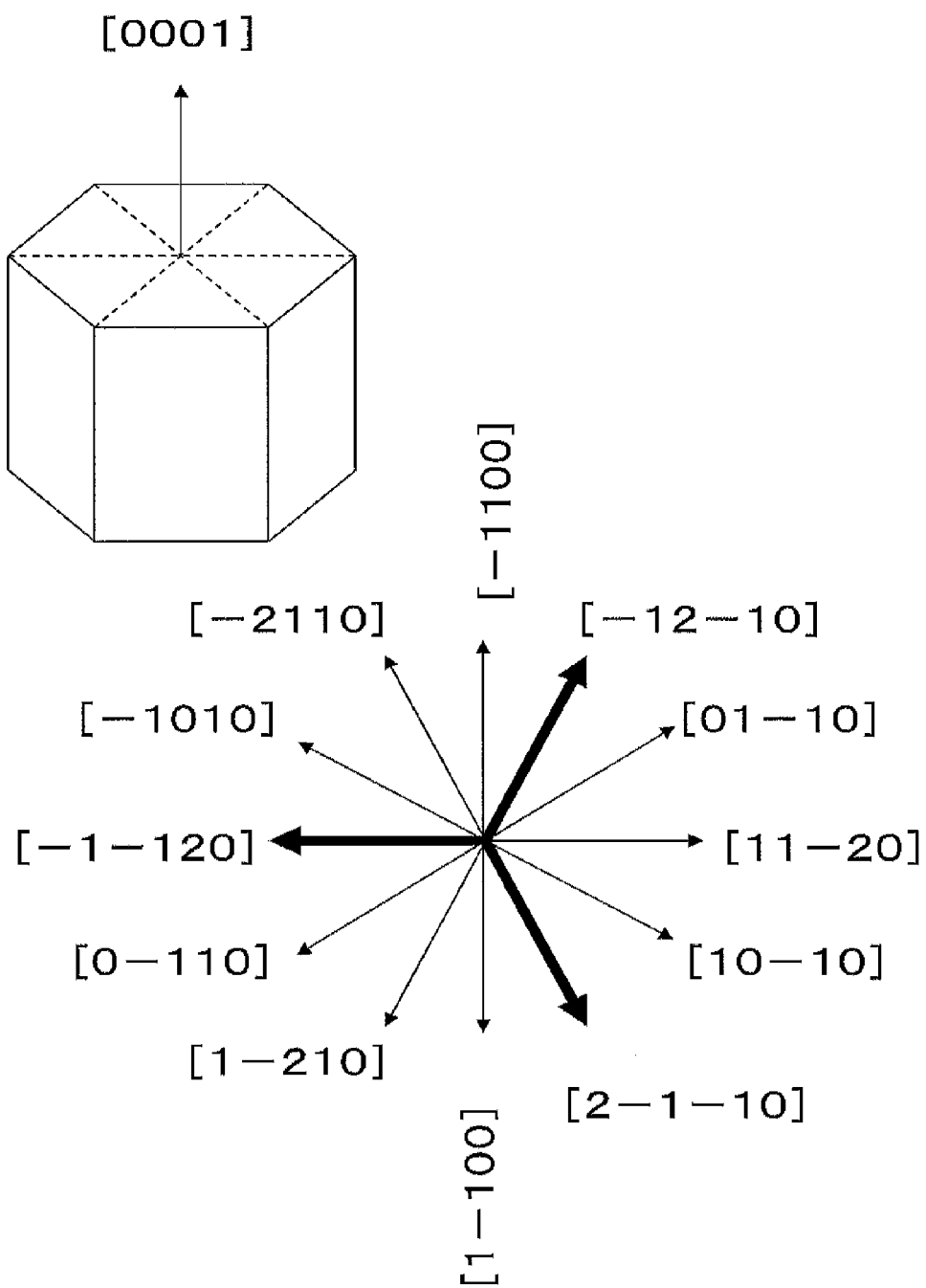
FIG. 2 is a diagram illustrating a <11-20> direction and a <1-100> direction in a hexagonal semiconductor.

The <11-20> direction collectively represents [11-20], [-12-10], [-2110], [-1-120], [1-210], and [2-1-10] directions which are spaced apart from one another at an angle of 60° in a hexagonal semiconductor as illustrated in FIG. 2. A <1-100> direction collectively represents [01-10], [-1100], [-1010], [0-110], [1-100], and [10-10] directions in a hexagonal semiconductor as illustrated in FIG. 2. For example, in FIG. 1(b), the [11-20] direction is expressed as <11-20> and the [-1100] direction is expressed as <1-100> in order to simplify the description.

Herein, "the <11-20> direction and the <1-100> direction orthogonally intersect each other" means that, after one direction is defined out of a plurality of equivalent directions that is one of the two sets of collectively expressed directions described above, a direction orthogonal to the defined direction is chosen out of a plurality of equivalent directions that is the other set of collectively expressed directions.

When the temperature of the semiconductor chip 21 changes, the semiconductor chip 21 is warped and consequently is supported at the corners of the semiconductor chip 21. In this embodiment, where the amount of change in the length of each first side 1A and the amount of change in the length of each second side 1B are substantially equal to each other in the semiconductor layer, a difference in stress applied to the four corners of the semiconductor chip 21 is smaller than in prior art. This prevents the stress applied to a specific corner from causing a crack in the semiconductor layer. In addition, stress generated between the semiconductor layer and the insulating film whose change in size upon a temperature change is isotropic is more uniform than in prior art. This prevents a crack from forming in the insulating film as well. Furthermore, the amount of change along the direction in which the first sides 1A extend and the amount of change along the direction in which the second sides 1B extend are equal to each other in the semiconductor layer, thereby making stress generated in the metal layer such as an electrode which is in contact with the semiconductor layer more uniform than in prior art as in the insulating film. This prevents the deformation of the electrode. A semiconductor device having high reliability is thus realized.

In this embodiment, the difference in thermal deformation amount between the first sides 1A (each having a length Lx) and second sides 1B (each having a length Ly) of the semiconductor chip 21 is preferably within 20%. In other words, the value of the thermal deformation amount ratio ($\Delta Lx/\Delta Ly$) preferably satisfies $0.8 \leq \Delta Lx/\Delta Ly \leq 1.2$. With the first sides 1A and the second sides 1B satisfying this condition, cracks in the semiconductor device 1 and in a protective film on the semiconductor device 1, electrode deformation, and the like can be prevented.

Figure 3:
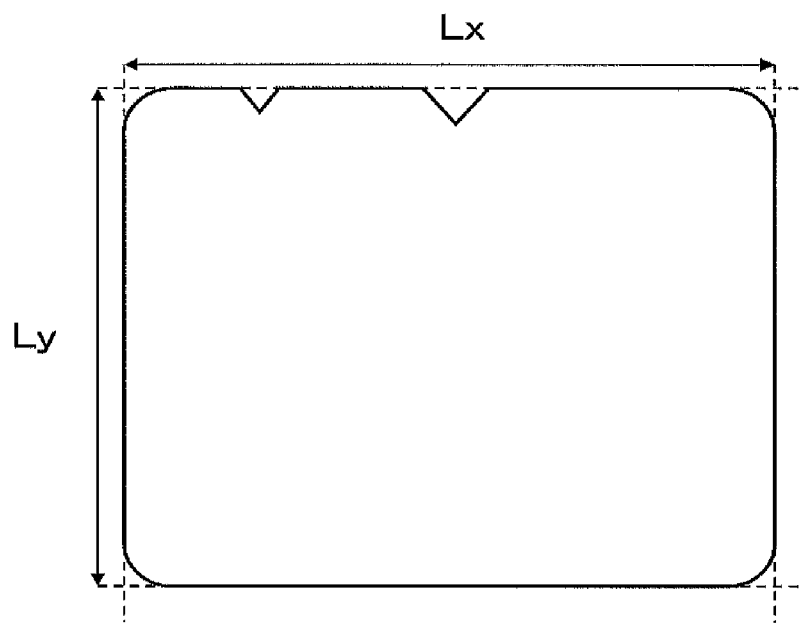
FIG. 3 is a schematic view illustrating the lengths of two sides of a semiconductor chip.

The length Lx of each first side 1A and the length Ly of each second side 1B each represent a gap between one of two pairs of opposing sides which define the rectangle as illustrated in FIG. 3. In the case where the four corners of the rectangle are rounded or a side is notched in places, the rounded corners or the notch are ignored in measuring the lengths of the sides.

The lengths Lx and Ly of the semiconductor chip 21 are readily measured by observing the cut out wafer of the semiconductor chip 21 with a microscope that has a scale. The crystal orientation can be analyzed with an X-ray diffractometer. The crystal orientation can be known also from a cleaving plane (or a cleaving direction) because a chip is cleaved along the crystal direction. For example, the cleaving direction in a 4H—SiC (0001) substrate is <11-20>.

When the first sides 1A are substantially parallel to the <11-20> direction (when an angle formed by one first side 1A and the <11-20> direction is 5° or less), the length ratio of one first side 1A and one second side 1B (Lx/Ly) is more desirably $1.05 \leq Lx/Ly \leq 1.6$. The length ratio is even more desirably $1.3 \leq Lx/Ly \leq 1.4$ in the case of SiC and $1.1 \leq Lx/Ly \leq 1.15$ in the case of GaN. Details thereof are described later with reference to FIG. 11(a).

When the first sides 1A are tilted from the <11-20> direction (when an angle formed by one first side 1A and the <11-20> direction is more than 5° and less than 15°), the length ratio of one first side 1A and one second side 1B (Lx/Ly) is determined in accordance with the angle of the tilt. Details thereof are described later with reference to FIG. 12.

Disposed on the semiconductor chip 21 are the semiconductor device 1 and a cutting margin remainder 20a, which is provided around the semiconductor device 1 (four ways viewed from a direction perpendicular to the top face of the semiconductor chip 21) and which has a width N. The semiconductor device 1 includes elements such as a MISFET and a guard ring area. The border between the semiconductor device 1 and the cutting margin remainder 20a is defined by first sides 1a of the semiconductor device 1 and second sides 1b, which are substantially orthogonal to the first sides 1a. The first sides 1a may be substantially parallel to the <11-20> direction or may extend in a direction tilted from the <11-20> direction. The second sides 1b are substantially perpendicular to the first sides 1a and, in the case where the first sides 1a are substantially parallel to the <11-20> direction, are substantially parallel to the crystal orientation <1-100>.

The semiconductor layer provided in the semiconductor chip 21 is usually a layer formed on a substrate by epitaxial growth. A part of the substrate that is under the semiconductor layer may be left or removed.

The semiconductor chip 21 of FIG. 1(a) is obtained by cutting a semiconductor wafer. FIG. 1(b) is a plan view illustrating a part of a semiconductor wafer 3a of this embodiment. As illustrated in FIG. 1(b), a plurality of semiconductor devices 1 is arranged in a matrix pattern on the semiconductor wafer 3a of this embodiment.

Cutting lines 2a substantially parallel to the <11-20> direction and cutting lines 2b substantially perpendicular to the cutting lines 2a (in other words, extending in the <1-100> direction) are arranged on the semiconductor wafer 3a. The cutting lines 2a are each positioned in an area between the first sides 1a of two adjacent semiconductor devices 1 to extend substantially parallel to the first sides 1a. The cutting lines 2b are each positioned in an area between the second sides 1b of two adjacent semiconductor devices 1 to extend substantially parallel to the second sides 1b. Cutting margin areas 20 are disposed between one first side 1a and one cutting line 2a, and between one second side 1b and one cutting line 2b. The cutting margin areas 20 provided in the <11-20> direction and the cutting margin areas 20 provided in the <1-100> direction both have a width Z.

Cutting the semiconductor wafer 3a along the cutting lines 2a and 2b produces the semiconductor chip 21 of FIG. 1(a). The semiconductor chip 21 is cut out of the semiconductor wafer 3a preferably by dicing or other similar cutting methods. When these cutting methods are used, considering the cutting yield (the count of chips yielded), it is preferred to lay the cutting lines 2a and 2b substantially orthogonal to each other.

The cutting margin areas 20 each having a width of Z are provided between adjacent semiconductor devices 1 on the semiconductor wafer 3a. Cutting the semiconductor wafer 3a causes a loss of a part of each cutting margin area 20 which corresponds to the width of a dicing blade or the like. As a result, the cutting margin remainder 20a has a width N in each semiconductor chip 21 as illustrated in FIG. 1(a). The length Lx of each first side 1A of the semiconductor chip 21 has a value obtained by adding the width N of the cutting margin remainder 20a on one side and the width N of the cutting margin remainder 20a on the other side to a length 1x of each first side 1a of the semiconductor device 1. The length Ly of each second side 1B of the semiconductor chip 21 has a value obtained by adding the width N of the cutting margin remainder 20a on one side and the width N of the cutting margin remainder 20a on the other side to a length 1y of each second side 1b of the semiconductor device 1. In the case where the whole cutting margin remainder 20a illustrated in FIG. 1(a) is lost due to the cutting of the semiconductor wafer 3a, the width of the semiconductor device 1 becomes equal to the width of the semiconductor chip 21.

Figure 4:
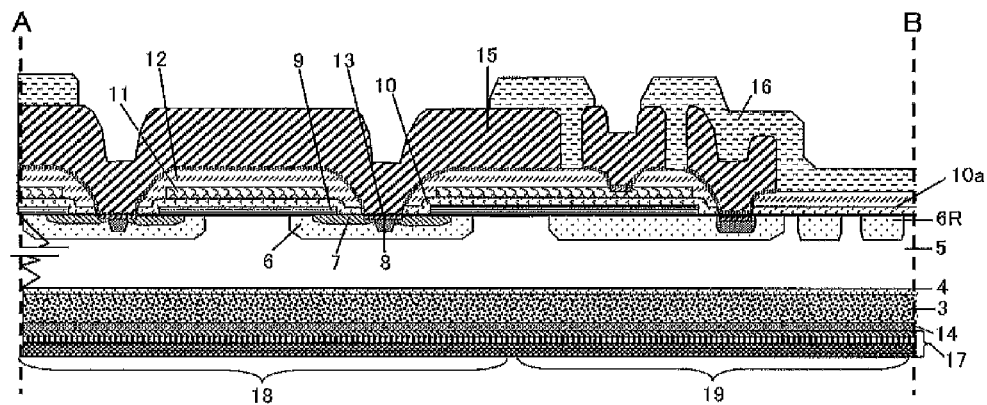
FIG. 4 is a sectional view schematically illustrating the structure of the semiconductor device 1 according to the embodiment.

FIG. 4 is a diagram illustrating a part of the semiconductor device 1 of FIG. 1(a) in section (a sectional view taken along the line A-B). In FIG. 4, a double-implanted MISFET (hereinafter abbreviated as DMISFET) region 18 which has a vertical power MISFET structure and a field limited ring (FLR) region 19 which is a terminating guard ring are defined. The FLR region 19 viewed from a direction perpendicular to the substrate is formed in a region that surrounds the DMISFET region 18.

As illustrated in FIG. 4, the DMISFET of this embodiment includes a first conductivity-type silicon carbide substrate 3, a buffer layer 4, which is formed on the principal surface of the silicon carbide substrate 3 from first conductivity-type silicon carbide lower in dopant concentration than the silicon carbide substrate 3, and a drift epitaxial layer (hereinafter abbreviated as drift epi layer) 5, which is formed on the principal surface of the buffer layer 4 from first conductivity-type silicon carbide even lower in dopant concentration than the buffer layer 4.

The principal surface of the drift epi layer 5 of this embodiment may be a (0001) plane or a plane tilted from the (0001) plane by $\theta°$ ($-10 \leq \theta \leq 10$) (an off-cut plane). This is because the crystal orientation exposed along the first sides 1A and second sides 1B of the semiconductor chip 21 is substantially the same irrespective of whether the principal surface of the drift epi layer 5 is the (0001) plane or the off-cut plane.

A second conductivity-type body region 6 is formed in a portion of a surface layer of the drift epi layer 5 that is in the DMISFET region 18. A first conductivity-type source region 7 and a second conductivity-type contact region 8 are disposed inside the body region 6. The source region 7 viewed from a direction perpendicular to the substrate surrounds the contact region 8, although an illustration thereof is omitted.

A source ohmic electrode 13 is provided above the contact region 8 and its surrounding source region 7. The source ohmic electrode 13 is formed from, for example, an alloy layer containing nickel, silicon, and carbon, or an alloy layer containing titanium, silicon, and carbon.

In the DMISFET region 18, a channel epitaxial layer (hereinafter abbreviated as channel epi layer) 9 is further formed from silicon carbide above a portion of the drift epi layer 5 that is sandwiched between two body regions 6, and the body regions 6 and the source regions 7 that are on both sides of the portion of the drift epi layer 5. Portions of the channel epi layer 9 that are located above the body regions 6 function as channels of the MISFET.

A gate insulating film 10 formed from, for example, a silicon oxide film is provided on the channel epi layer 9. A gate electrode 11 formed from, for example, polysilicon is provided on the gate insulating film 10. The gate insulating film 10 is not limited to a silicon oxide film and may instead be a silicon oxynitride film or the like.

A pad electrode 15 formed from, for example, aluminum or an alloy layer containing aluminum is provided on the source ohmic electrode 13.

In a portion of the surface layer of the drift epi layer 5 that is in the FLR region 19, on the other hand, a plurality of second conductivity-type semiconductor ring regions 6R is formed at the same time the body region 6 is formed. Viewed from a direction perpendicular to the substrate, the semiconductor ring regions 6R are provided in a ring pattern that surrounds the DMISFET region 18. The semiconductor ring regions 6R are covered with an insulating film 10a, which is formed at the same time as the gate insulating film 10.

The gate electrode 11 and the gate insulating film 10 in the DMISFET region 18 and the insulating film 10a in the FLR region 19 are covered with an interlayer insulating film 12. The interlayer insulating film 12 is made from, for example, silicon oxide. A protective insulating film 16 is formed on the pad electrode 15.

A rear electrode 17 is formed on the rear surface of the silicon carbide substrate 3. The rear electrode 17 has a layered structure constituted of, for example, titanium/nickel/silver layers which are stacked in order from the side of the silicon carbide substrate 3. A drain ohmic electrode 14 is formed between the rear electrode 17 and the rear surface of the silicon carbide substrate 3. The drain ohmic electrode 14 is made from, for example, an alloy layer of nickel, silicon, and carbon or an alloy layer of titanium, silicon, and carbon similarly to the source ohmic electrode 13.

The first conductivity type in an example of this embodiment is n-type and, in the example of FIG. 4, the silicon carbide substrate 3 is an n-type SiC semiconductor substrate ($n^+$ SiC substrate), the buffer layer 4 is an $n^-$ layer, and the drift epi layer 5 is an $n^-$ layer. The body region 6 is a $p^-$ layer, the source region 7 is an $n^+$ layer, and the contact region 8 is a $p^+$ layer. The signs "+" and "−" each indicate the relative concentration of an n-type or p-type dopant. The concentration is higher when the number of "+" signs is larger, and is lower when the number of "−" signs are larger.

channel epi layer 9 of this embodiment is an insulating layer (or substantially an insulating layer), and may also be referred to as "i layer" or "channel epi i layer". However, the channel epi layer 9 may be a lightly-doped first conductivity-type ($n^-$) layer, or may have an impurity concentration that varies in a depth direction.

The silicon carbide substrate is made from hexagonal silicon carbide. The silicon carbide substrate 3 has a thickness of, for example, 250 to 350 μm and a concentration of, for example, 8E18 $cm^{-3}$. The expression 8E18 $cm^{-3}$ means $8 \times 10^{18}$ $cm^{-3}$ and, a similar expression for concentration may be used in the following description.

The buffer layer 4 and the drift epi layer 5 are SiC layers formed on the principal surface of the silicon carbide substrate 3 by epitaxial growth. The buffer layer 4 has a concentration of, for example, 6E16 $cm^{-3}$. The drift epi layer 5 has a thickness of, for example, 4 to 15 μm and a concentration of, for example, 5E15 $cm^{-3}$.

The thickness of the body region 6 (namely, the depth from the top face of the drift epi layer 5) is, for example, 0.5 to 1.0 μm. The impurity concentration of the body region 6 is, for example, 1.5E18 $cm^{-3}$. The thickness of the source region 7 (namely, the depth from the top face of the drift epi layer 5) is, for example, 0.25 μm. The impurity concentration of the source region 7 is, for example, 5E19 $cm^{-3}$. The contact layer ($p^+$ layer) 8 has a thickness of, for example, 0.3 μm and a concentration of, for example, 2E20 $cm^{-3}$. A region of the drift epi layer 5 in the DMISFET region 18 that is between two adjacent body regions 6 is defined as a "junction field effect transistor (hereinafter abbreviated as JFET) region". The JFET region has a length (width) of, for example, 3 μm.

The channel epi layer 9 is an SiC layer formed on the drift epi layer 5 by epitaxial growth. The channel epi layer 9 has a thickness of, for example, 30 nm to 150 nm and a length (width) of, for example, 0.5 μm. The gate insulating film 10 is made from, for example, $SiO_2$ (a silicon oxide film) and has a thickness of, for example, 70 nm. The gate electrode 11 is made from, for example, poly-Si (polysilicon) and has a thickness of, for example, 500 nm.

The source ohmic electrode 13 and the drain ohmic electrode 14 each have a thickness of, for example, 50 nm to 100 nm. In order to facilitate soldering for packaging the SiC chip in an epoxy resin package, nickel and silver or nickel and gold may be deposited as the rear electrode 17.

Figure 5:
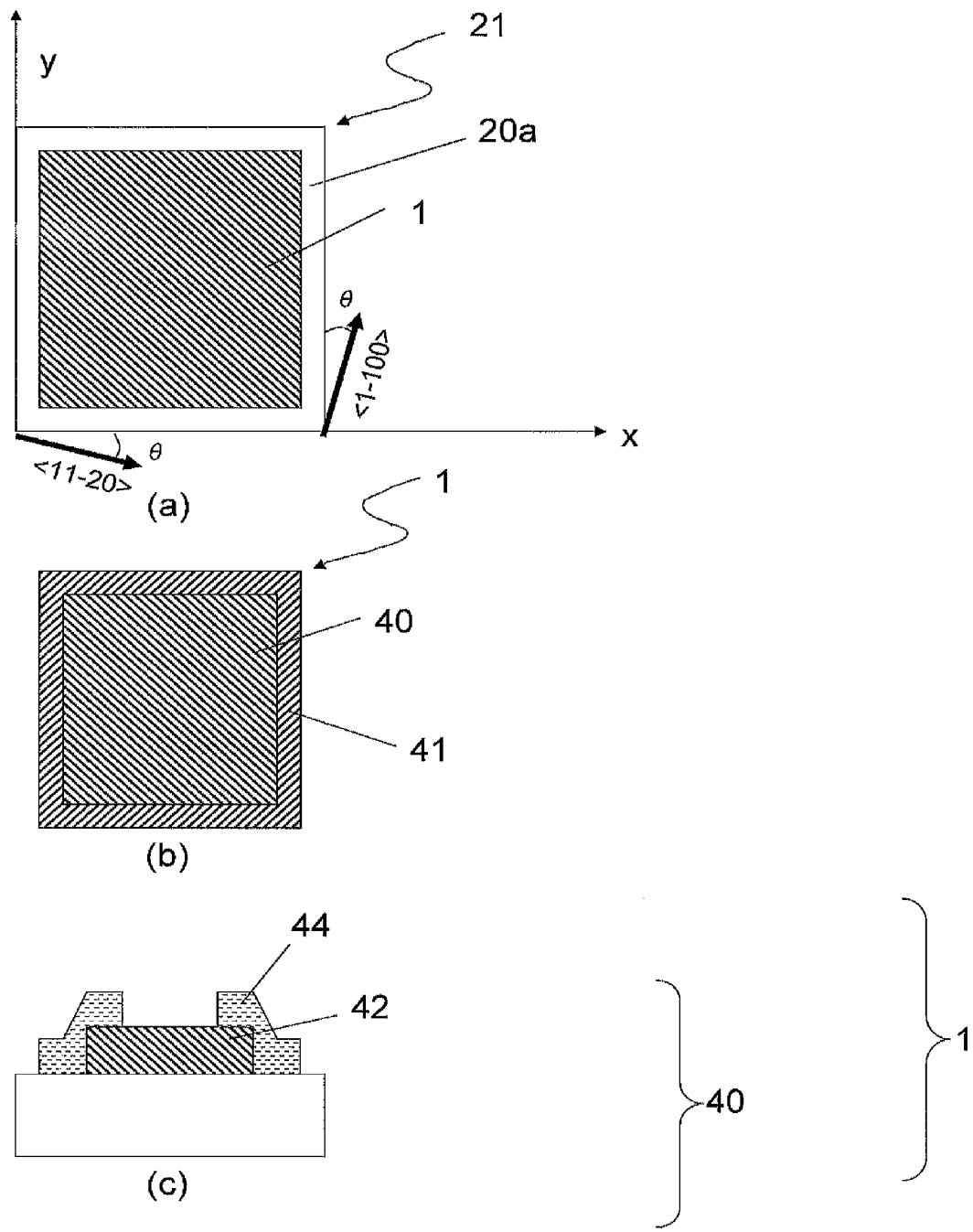
FIG. 5(a) is a plan view illustrating the semiconductor chip 21.
FIG. 5(b) is a plan view illustrating the semiconductor device 1.
FIG. 5(c) is a sectional view illustrating the semiconductor device 1.

FIG. 5(a) is a plan view illustrating the semiconductor chip 21. The semiconductor chip 21 is constituted of the semiconductor device 1 and the cutting margin remainder 20a. The size of the semiconductor chip 21 is, for example, 3.7 mm square. The directions of two orthogonally intersecting sides in the semiconductor chip 21 are denoted by x and y. The direction x is parallel to the <11-20> direction or tilted from the <11-20> direction by an angle less than 15°. The direction y is parallel to the <1-100> direction or tilted from the <1-100> direction by an angle less than 15°.

The semiconductor device 1 is constituted of, as illustrated in FIG. 5(b), a semiconductor element 40 and a termination region 41 such as a guard ring. The termination region 41 may not exist in some cases. A schematic sectional view of the semiconductor device 1 is illustrated in FIG. 5(c). The semiconductor device 1 includes the semiconductor element 40, an insulating film 44, which protects a part of the semiconductor element 40, and a wiring electrode 42, which is provided on a surface of the semiconductor element 40.

Figure 6:
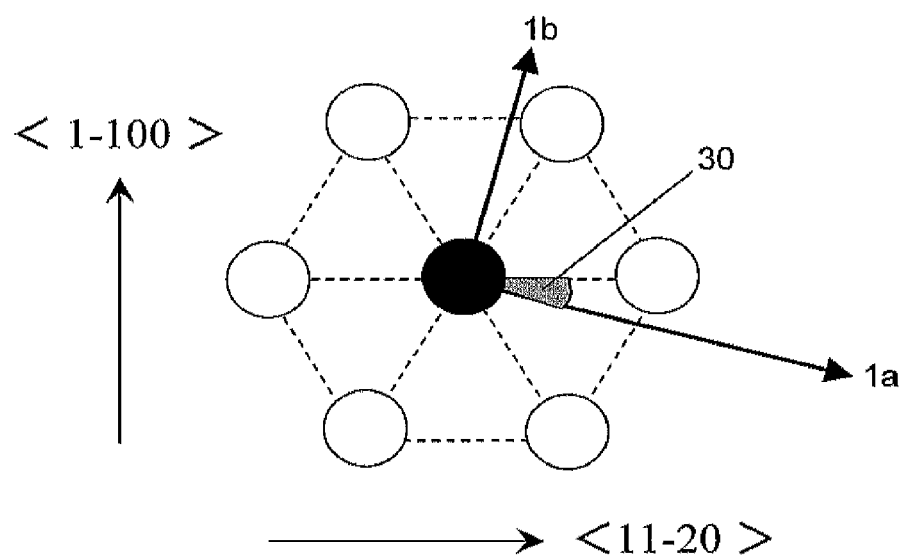
FIG. 6 is a diagram schematically illustrating the simplified crystal structure of a hexagonal semiconductor viewed from a c-axis (0001) plane, and a rotation angle 30 with respect to each crystal direction.

The inventors of the present invention conducted a simulation of mechanical properties (linear expansion coefficient and Young's modulus) by varying the crystal orientation along the first sides 1A and second sides 1B of the semiconductor chip 21. FIG. 6 is a diagram illustrating a relation between the first sides 1A and second sides 1B of the semiconductor chip 21 and the crystal structure. FIG. 6 schematically illustrates the structure of a hexagonal semiconductor viewed from the c-axis <0001> direction. In the case where the hexagonal semiconductor of FIG. 6 is SiC, an atom (a molecule (an Si—C bond)) colored in black is a reference atom (molecule) and an atom colored in white is an atom (a molecule) bonded with the reference atom (molecule). An angle between one first side 1A (the x-axis) of the semiconductor chip 21 and the <11-20> direction is the rotation angle 30. The rotation angle 30 is 0° when the first side 1A (the x-axis) extends along the <11-20> direction. Each second side 1B (the y-axis) is disposed in a direction substantially orthogonal to the first side 1A.

Prior to calculation, property values to serve as a reference were obtained by measuring the linear expansion coefficient and Young's modulus of a 4H—SiC semiconductor chip with the use of a high-definition CCD camera called digital image correlation (DIC) and a 3D stereo measuring method.

As a sample for measuring the linear expansion coefficient, a 4H—SiC semiconductor chip A was prepared in which the rotation angle 30 was 0°, in other words, the first sides 1A were substantially parallel to the <11-20> direction and the second sides 1B were perpendicular to the first sides 1A. In this measurement sample semiconductor chip, the length (Lx) of each first side 1A and the length (Ly) of each second side 1B were each 12 mm (namely, Lx/Ly=12 mm/12 mm=1). The measurement was performed at a temperature varying from room temperature (25° C.) to 250° C.

Figure 7:
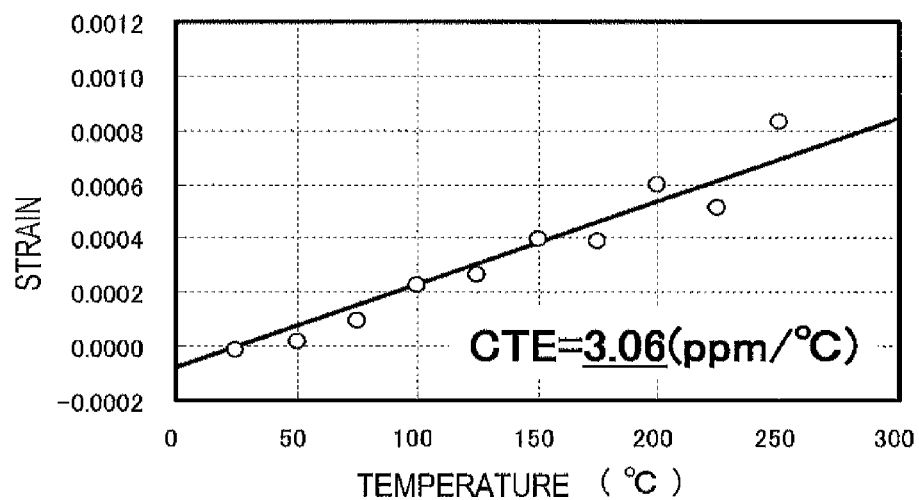
FIGS. 7(a) and 7(b) are graphs showing respectively results of measuring the linear expansion coefficient in the <11-20> direction and the linear expansion coefficient in the <1-100> direction in a 4H—SiC chip.
Figure 7:
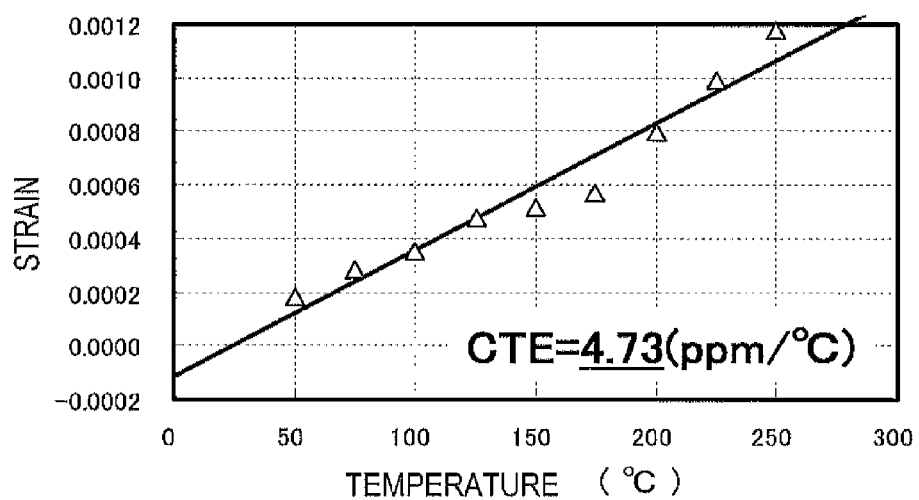

FIGS. 7(a) and 7(b) are graphs showing results of measuring the linear expansion coefficient along the <11-20> direction (the x-axis) and the linear expansion coefficient along the <1-100> direction (the y-axis) in the 4H—SiC chip A. As shown in FIGS. 7(a) and 7(b), the linear expansion coefficient in the <11-20> direction was $3.06 \times 10^{-6}$/° C. and the linear expansion coefficient in the <1-100> direction was $4.73 \times 10^{-6}$/° C. According to the results, the value of the linear expansion coefficient in the <1-100> direction is 1.5 times the value of the linear expansion coefficient in the <11-20> direction or more.

In measurement of the Young's modulus, a sample needs to be held in a nano mechanical tester. Therefore, a 4H—SiC chip B in which Lx/Ly was set to 40 mm/6 mm was prepared for measuring the Young's modulus in the x-axis direction and a 4H—SiC chip C in which Lx/Ly was set to 6 mm/40 mm was prepared for measuring the Young's modulus in the y-axis direction. The measurement was performed only at room temperature (25° C.).

Figure 8:
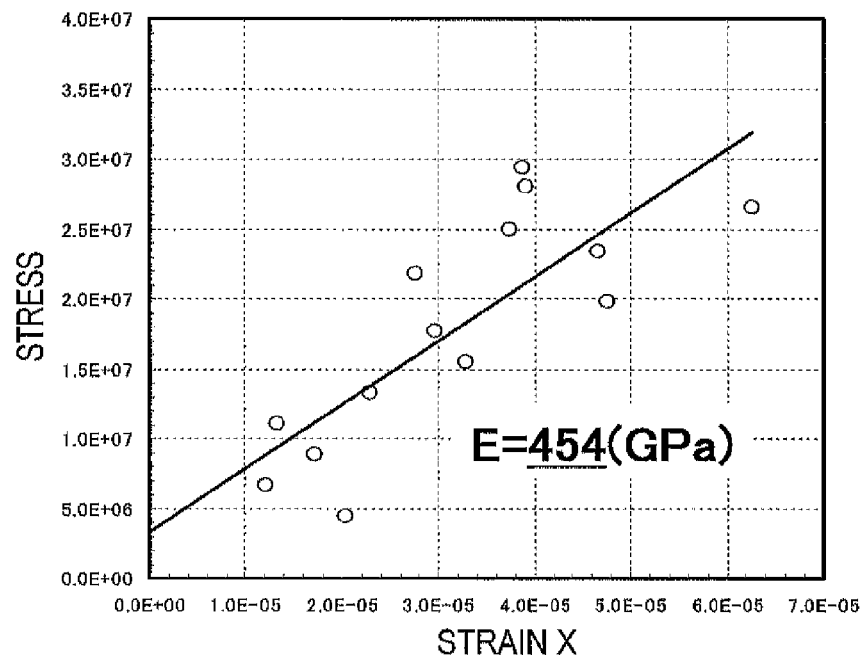
FIGS. 8(a) and 8(b) are graphs showing respectively results of measuring the Young's modulus in the <11-20> direction and the Young's modulus in the <1-100> direction in 4H—SiC chips.
Figure 8:
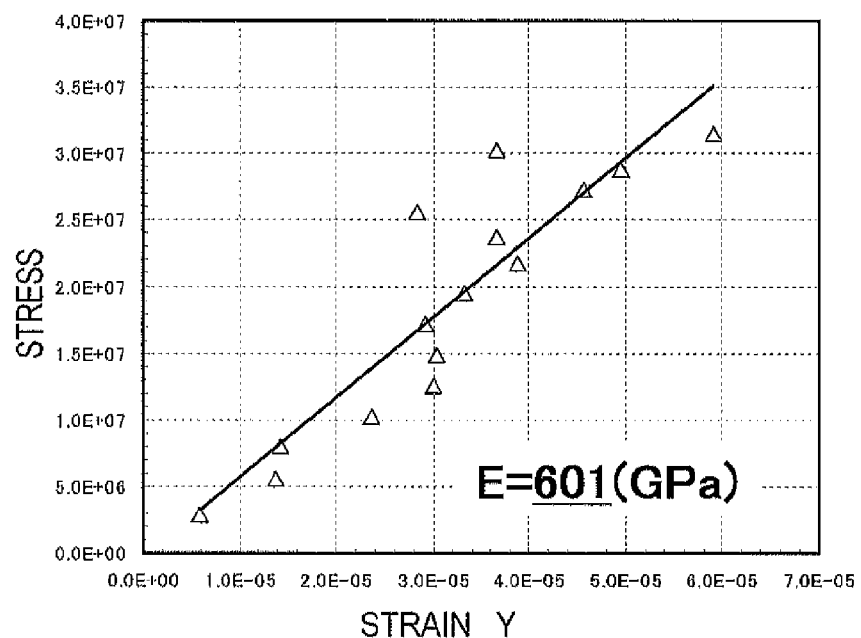

FIGS. 8(a) and 8(b) are graphs showing results of measuring the Young's modulus along the <11-20> direction and the Young's modulus along the <1-100> direction in the 4H—SiC chips B and C. As shown in FIGS. 8(a) and 8(b), the Young's modulus in the <11-20> direction was 454 GPa and the Young's modulus in the <1-100> direction was 601 GPa. According to the results, the value of the Young's modulus in the <1-100> direction is 1.3 times the value of the Young's modulus in the <11-20> direction or more. It was confirmed from the above results that the mechanical properties (linear expansion coefficient and Young's modulus) of 4H—SiC varied depending on the crystal orientation.

Figure 9:
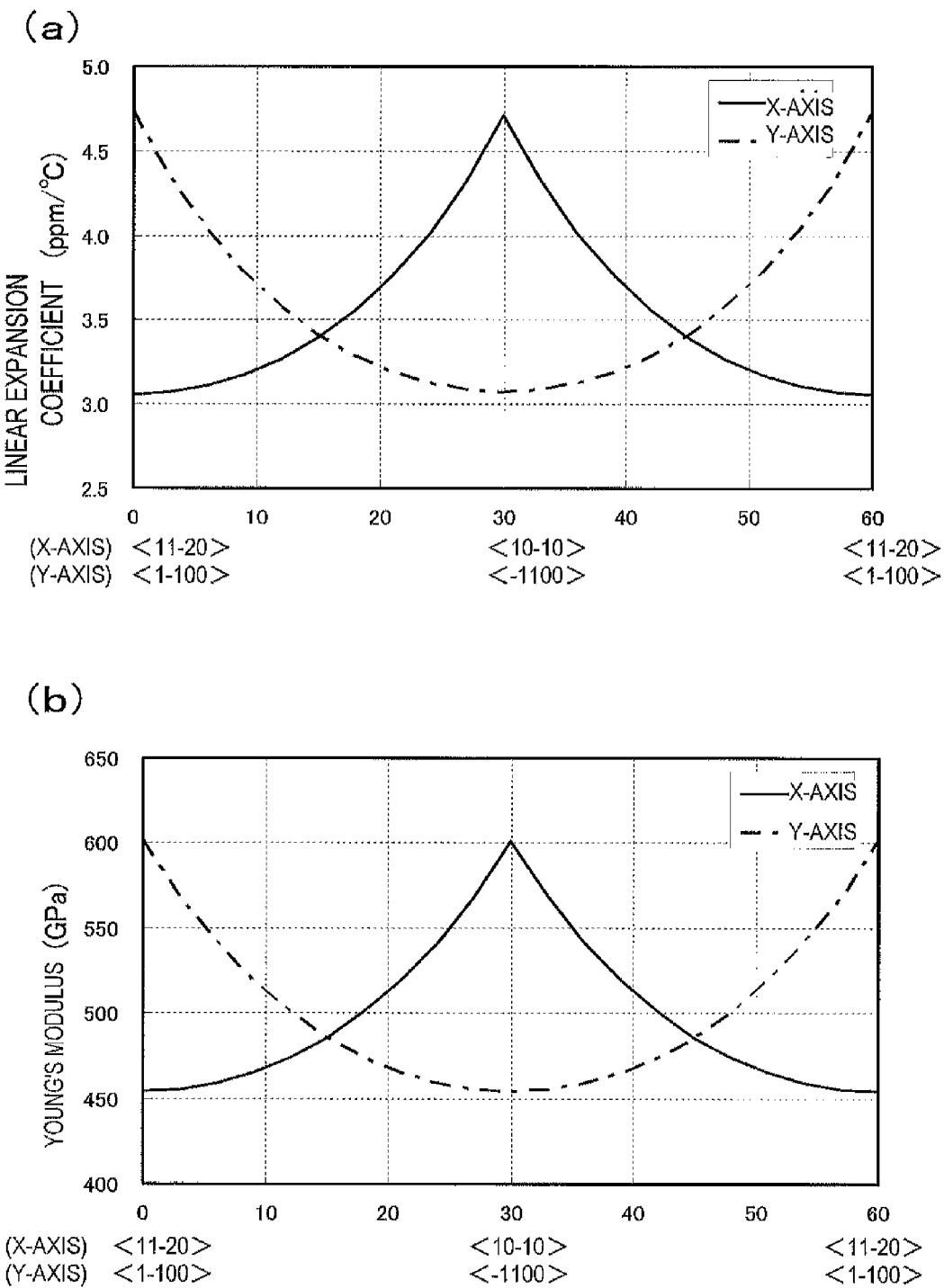
FIGS. 9(a) and 9(b) are graphs showing respectively changes in linear expansion coefficient and changes in Young's modulus that occur when a first side and second side of a 4H—SiC chip are rotated.

FIGS. 9(a) and 9(b) are graphs showing results of calculating the effect of changing the rotation angle 30 of FIG. 6 on the linear expansion coefficients and Young's moduli along the first side 1A (the x-axis) and along the second side 1B (the y-axis). The calculation used the physical property values of FIGS. 7(a) and 7(b) and FIGS. 8(a) and 8(b) (values obtained when the rotation angle 30 is 0°) as reference.

As shown in FIG. 9(a), the linear expansion coefficient along the x-axis increases when the rotation axis is 0° to 30° and decreases when the rotation axis is 30° to 60°. The linear expansion coefficient along the y-axis decreases when the rotation axis is 0° to 30° and increases when the rotation axis is 30° to 60°. The linear expansion coefficient along the x-axis and the linear expansion coefficient along the y-axis are equal to each other at 15° and 45°. The Young's moduli shown in FIG. 9(b) exhibit the same pattern as that of the linear expansion coefficients of FIG. 9(a). In short, the values of the linear expansion coefficient and Young's modulus of 4H—SiC are both larger along the y-axis than along the x-axis when the rotation angle 30 is less than 15°, and the values along the x-axis and the values along the y-axis are equal to each other when the rotation angle 30 is 15°. The values of the linear expansion coefficient and Young's modulus of 4H—SiC are larger along the x-axis than along the y-axis when the rotation angle 30 is more than 15° and less than 45°, and the values along the x-axis and the values along the y-axis become equal to each other again when the rotation angle 30 is 45°. The values along the y-axis are larger than the values along the x-axis when the rotation angle 30 exceeds 45°. The linear expansion coefficient value and the Young's modulus value that are measured along the x-axis when the rotation angle 30 is 30° are respectively equal to the linear expansion coefficient value and the Young's modulus value that are measured along the y-axis when the rotation angle 30 is 0°.

Figure 10:
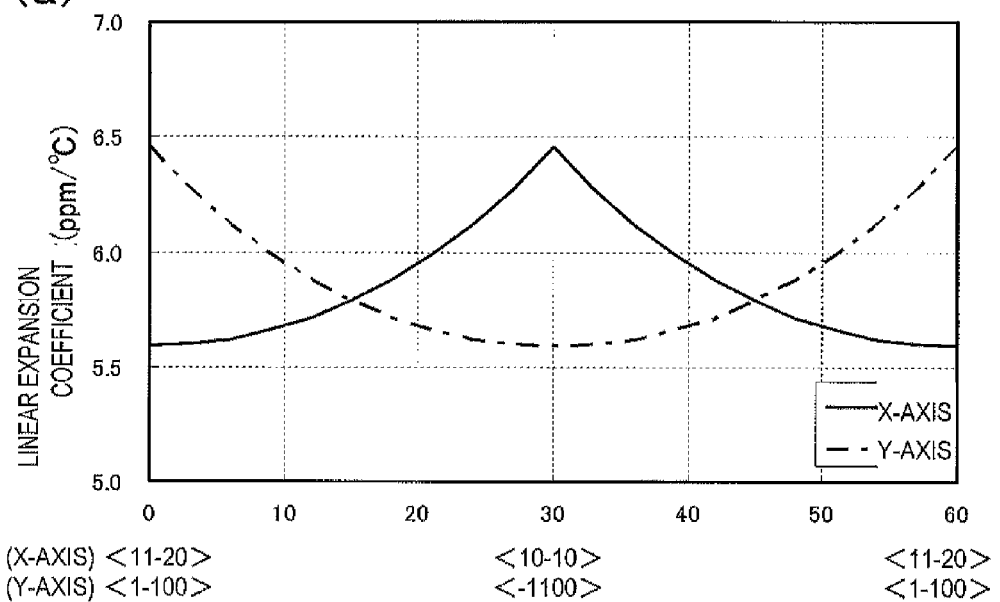
FIGS. 10(a) and 10(b) are graphs showing respectively changes in linear expansion coefficient and changes in Young's modulus that occur when the first side and second side of a GaN (wurtzite) chip are rotated.
Figure 10:
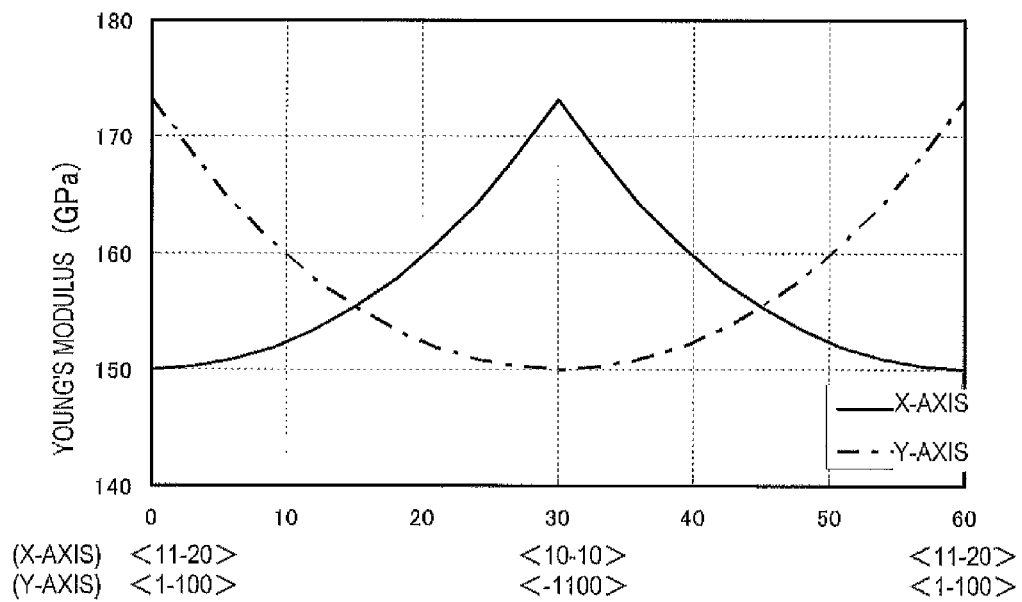

FIGS. 10(a) and 10(b) are graphs showing results of calculating the effect of changing the rotation angle 30 on the linear expansion coefficients and Young's moduli of GaN (wurtzite) along the first side 1A (the x-axis) and along the second side 1B (the y-axis). The calculation used values of Non-patent Document 2 as reference physical property values of GaN. It can be seen in FIG. 10 that the relation of the rotation angle 30 with the linear expansion coefficient and Young's modulus in GaN has the same pattern as in 4H—SiC.

A structural analysis simulation by the finite element method was used next to examine the effect of semiconductor chip dimensions on thermal deformation amount and stress.

Figure 11:
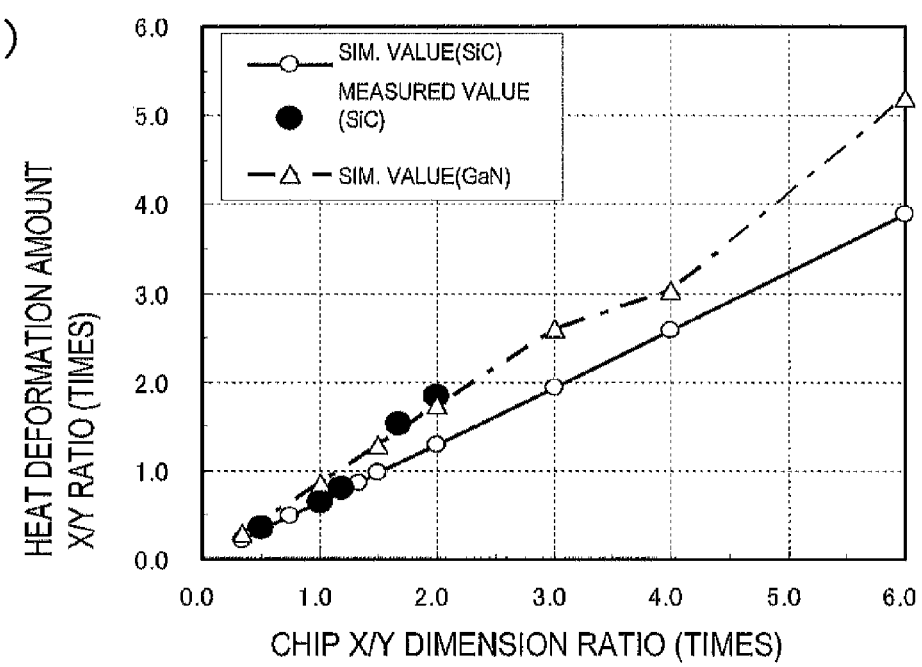
FIG. 11(a) is a graph showing results of analyzing, by the finite element method, for a 4H—SiC chip and a GaN (wurtzite) chip each, a relation between the dimension ratio and thermal deformation amount ratio (ΔLx/ΔLy) of two orthogonally intersecting sides (an x-axis and a y-axis) of the semiconductor chip.
FIG. 11(b) is a graph showing results of analyzing, by the finite element method, for the 4H—SiC chip and the GaN (wurtzite) chip each, a relation between the dimension ratio of two orthogonally intersecting sides (the x-axis and the y-axis) of the semiconductor chip and the effect on equivalent stress (a maximum value) in chip corner portions.
Figure 11:
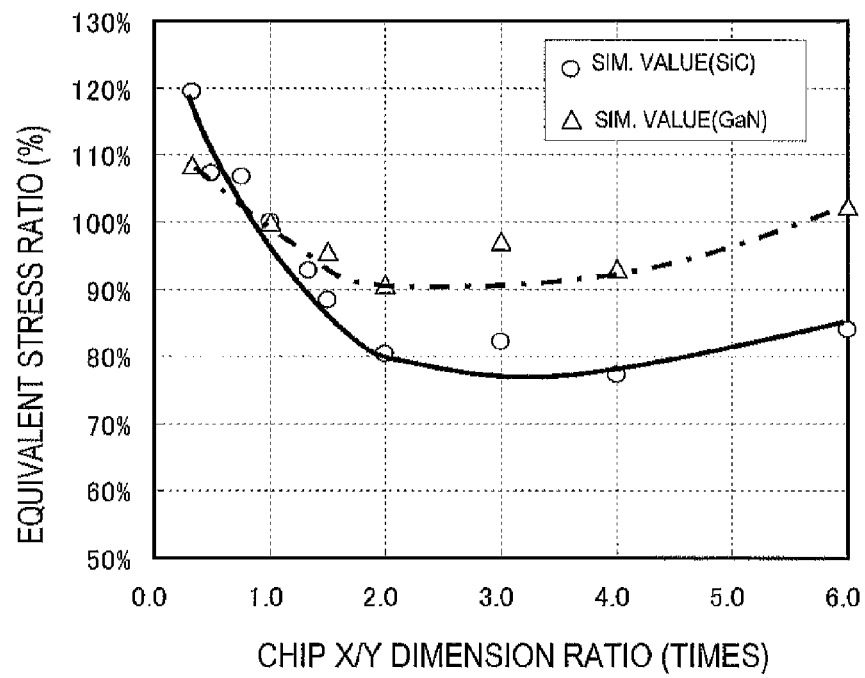

FIG. 11(a) is a graph showing results of calculating, for a 4H—SiC semiconductor chip and a GaN semiconductor chip each, the thermal deformation amount ratio of the x-axis and the y-axis by a simulation. The axis of abscissa in FIG. 11(a) represents the value of the length (Lx) of each first side 1A of the semiconductor chip to the length (Ly) of each second side 1B of the semiconductor chip. The rotation angle 30 was set to 0° in this simulation.

This simulation uses the measured values as the physical property values of 4H—SiC and uses the document values as the physical property values of GaN as in the simulations the results of which are shown in FIGS. 9(a) and 9(b) and FIGS. 10(a) and 10(b). In the graph, white circles represent simulation results of 4H—SiC and white triangles represent simulation results of GaN. The graph also shows the results of measuring the thermal deformation amount (black circles) as a reference. In order to simplify the simulation, calculation was made for a semiconductor chip that is constituted of a semiconductor substrate and a semiconductor layer which exhibit anisotropic mechanical properties and omits a protective film (an insulating film), resin, solder, and a wire which exhibit isotropic mechanical properties. Another premise of the calculation is that the temperature of the semiconductor substrate is 150° C. while the device is in operation. It is deduced that simulation results of a chip that has an insulating film formed from silicon nitride or the like will exhibit substantially the same pattern as that of this simulation.

As shown in FIG. 11(a), in the SiC semiconductor chip and the GaN semiconductor chip both, a thermal deformation amount ratio X/Y (ΔLx/ΔLy) is smaller than 1.0 when a chip X/Y dimension ratio (Lx/Ly) is 1.0, namely, when the length of each first side of the semiconductor chip and the length of each second side of the semiconductor chip are equal to each other. The thermal deformation amount ratio X/Y (ΔLx/ΔLy) increases as the chip X/Y dimension ratio (Lx/Ly) becomes larger. This shows that the difference between the thermal deformation amount along the first sides and the thermal deformation amount along the second sides can be reduced by setting the chip X/Y dimension ratio (Lx/Ly) larger than 1.0, in other words, setting the length of each first side longer than the length of each second side.

According to FIG. 11(a), the thermal deformation amount ratio X/Y (ΔLx/ΔLy) is approximately 0.8 or more and 1.2 or less when the chip X/Y dimension ratio (Lx/Ly) is 1.1 or more and 1.6 or less in the case of SiC, and 1.05 or more and 1.2 or less in the case of GaN. It is understood from the results that, although the pattern of SiC and the pattern of GaN slightly differ from each other, the thermal deformation amount along the x-axis and the thermal deformation amount along the y-axis are substantially equal to each other and the strain is uniform when the chip X/Y dimension ratio (Lx/Ly) is 1.05 or more and 1.6 or less. When the chip X/Y dimension ratio (Lx/Ly) is 1.3 or more and 1.4 or less in the case of SiC and 1.1 or more and 1.15 or less in the case of GaN, the thermal deformation amount ratio X/Y (ΔLx/ΔLy) is approximately ×1 and the strain is therefore most uniform. The measured values represented by black circles in the graph match well with the simulation results (white circles and white triangles) on the whole.

In the simulation of FIG. 11(a), the assumed operating temperature is 150° C. as mentioned above. The linear expansion coefficient of SiC has a constant value within the range of 0° C. to 300° C. as described with reference to FIGS. 7(a) and 7(b). It is therefore deduced that the same pattern as in the graph of FIG. 11(a) will be observed when the temperature is changed from, for example, room temperature (25° C.) or more to 150° C.±5° C. or less. It is also deduced that the same pattern as in the graph of FIG. 11(a) will be observed when a chip using SiC operates at a normal operating temperature (for example, 100° C. or more and 200° C. or less). The same pattern will be observed also when a chip using GaN operates at a normal operating temperature.

FIG. 11(b) is a graph showing results calculating, for a 4H—SiC semiconductor chip and a GaN semiconductor chip each, an equivalent stress value (a maximum value) at corner portions of the semiconductor chips by simulation. This simulation uses the chip X/Y dimension ratio (Lx/Ly) as a parameter as in the simulation the results of which are shown in FIG. 11(a). The axis of abscissa in FIG. 11(b) represents the chip X/Y dimension ratio (Lx/Ly). The axis of ordinate in FIG. 11(b) represents an equivalent stress ratio at each Lx/Ly value, with an equivalent stress value at an Lx/Ly value of 1 as a reference (100%). The simulation the results of which are as shown in FIG. 11(b) uses the measured values as the physical property values of 4H—SiC and uses the document values as the physical property values of GaN as in the simulation the results of which are shown in FIG. 11(a). In order to simplify the simulation, calculation was made for a semiconductor chip that is constituted of a semiconductor substrate and a semiconductor layer which exhibit anisotropic mechanical properties and omits a protective film (an insulating film), resin, solder, and a wire which exhibit isotropic mechanical properties. Another premise of the calculation is that the temperature of the semiconductor substrate is 150° C. while the device is in operation.

As shown in FIG. 11(b), 4H—SiC and GaN slightly differ from each other in stress reducing effect but exhibit substantially the same pattern. In 4H—SiC and GaN both, the equivalent stress ratio is lower than 100% when the chip X/Y dimension ratio (Lx/Ly) satisfies 1.05≦Lx/Ly≦1.6. The results show that the equivalent stress ratio is lower when the chip X/Y dimension ratio (Lx/Ly) satisfies 1.05≦Lx/Ly≦1.6 than when the chip X/Y dimension ratio is 1. The equivalent stress ratio is further lowered when the chip X/Y dimension ratio is greater than 1.6 times and reaches a local minimum value when the chip X/Y dimension ratio is twice. It is surmised that the equivalent stress ratio is low at this value because of other factors.

Figure 12:
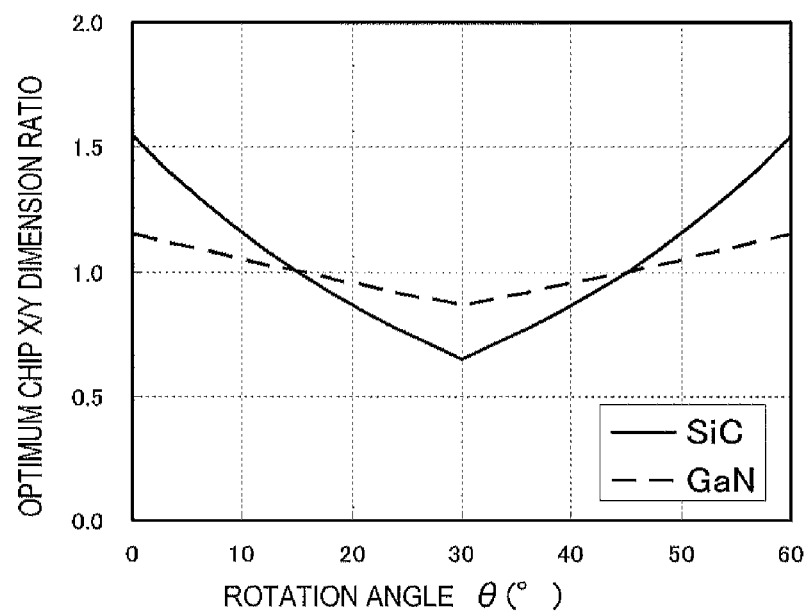
FIG. 12 is a graph showing a relation between the rotation angle 30 and an optimum X/Y dimension ratio (Lx/Ly) of a semiconductor chip.

FIG. 12 is a graph showing a relation between the rotation angle 30 of one first side 1A from the <11-20> direction and an optimum X/Y dimension ratio (Lx/Ly) of a semiconductor chip. The X dimension Lx and Y dimension Ly of the semiconductor chip are defined here as dimensions at room temperature (25° C.). The axis of abscissa in FIG. 12 represents the rotation angle 30 and the axis of ordinate represents an optimum X/Y dimension ratio (Lx/Ly) of the semiconductor chip. The optimum X/Y dimension ratio (Lx/Ly) is the ratio of dimensions that make the thermal deformation amount in the x direction and the thermal deformation amount in the y direction equal to each other. As shown in FIG. 12, SIC and GaN exhibit the same pattern in which the value of the axis of ordinate is maximum when the rotation angle 30 is 0° and 60°, is 1 when the rotation angle 30 is 15°, and is minimum when the rotation angle 30 is 30°. However, the maximum value and minimum value of the axis of ordinate differ between SiC and GaN.

Figure 13:
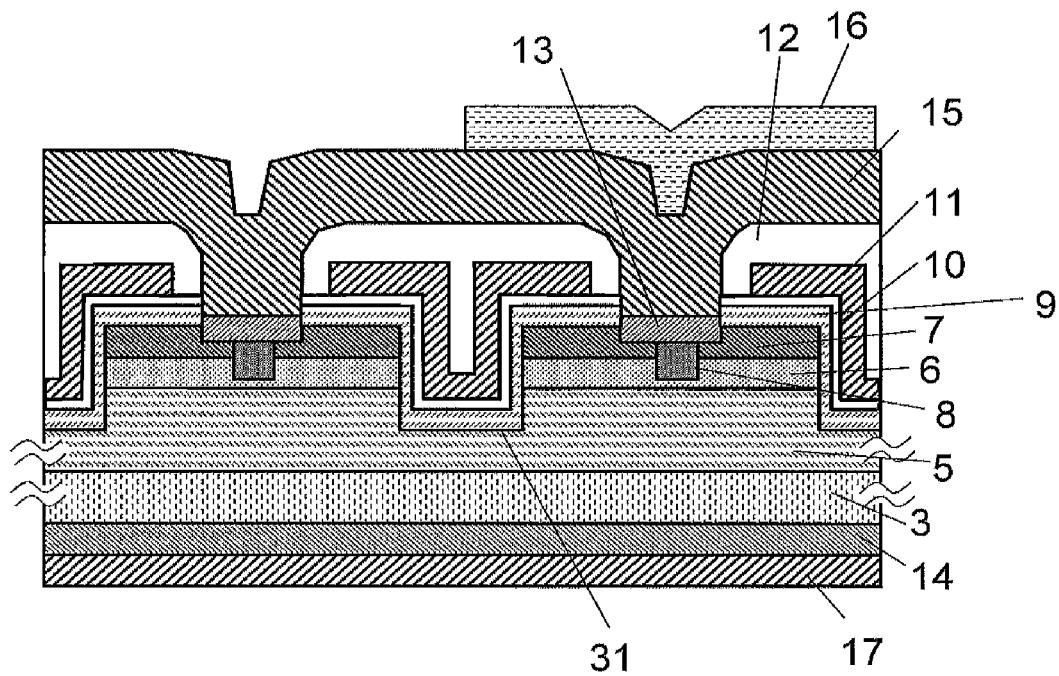
FIG. 13 is a sectional view illustrating another structure of the semiconductor device 1 according to the embodiment.

The semiconductor element illustrated in FIG. 4 is a DMISFET. The semiconductor element of the present invention, however, is not limited thereto and may be, for example, a trench MISFET. FIG. 13 is a sectional view illustrating a trench MISFET that uses 4H—SiC. As illustrated in FIG. 13, the trench MISFET of this embodiment includes the first conductivity-type silicon carbide substrate 3 and the drift epi layer 5 formed on the principal surface of the silicon carbide substrate 3. Between the silicon carbide substrate 3 and the drift epi layer 5, there may be formed the buffer layer 4 which has an impurity concentration between the impurity concentrations of these two layers.

The second conductivity-type body region 6 is formed in a surface layer of the drift epi layer 5. The first conductivity-type source region 7 and the second conductivity-type contact region 8 are disposed inside the body region 6.

The body region 6 and the source region 7 are partitioned into segments by a trench 31. The trench 31 is provided so as to pierce the body region 6 and the source region 7. The bottom of the trench 31 is placed in the drift epi layer 5.

A source ohmic electrode 13 is provided above the contact region 8 and its surrounding source region 7. The source ohmic electrode 13 is formed from, for example, an alloy layer containing nickel, silicon, and carbon, or an alloy layer containing titanium, silicon, and carbon.

The channel epi layer 9 is formed from silicon carbide on the source region 7, which surrounds the source ohmic electrode 13, and on the surface of the trench 31. A portion of the channel epi layer 9 that is in contact with the body region 6 functions as a channel of the MISFET. The gate insulating film 10 is formed on the channel epi layer 9 from, for example, a silicon oxide film. The gate electrode 11 is formed on the gate insulating film 10 from, for example, polysilicon. The interlayer insulating film 12 formed from, for example, silicon oxide is provided on the gate electrode 11 and the gate insulating film 10.

A pad electrode 15 formed from, for example, aluminum or an alloy layer containing aluminum is provided on the source ohmic electrode 13 and the interlayer insulating film 12. The protective insulating film 16 is formed on the pad electrode 15 from an insulator containing silicon nitride. A preferred thickness of the interlayer insulating film 12 and a preferred thickness of the protective insulating film 16 are respectively 1 µm or more and 1.5 µm or more.

A rear electrode 17 is formed on the rear surface of the silicon carbide substrate 3. The rear electrode 17 has a layered structure constituted of, for example, titanium/nickel/silver layers which are stacked in order from the side of the silicon carbide substrate 3. A drain ohmic electrode 14 is formed between the rear electrode 17 and the rear surface of the silicon carbide substrate 3. The drain ohmic electrode 14 is made from, for example, an alloy layer of nickel, silicon, and carbon or an alloy layer of titanium, silicon, and carbon similarly to the source ohmic electrode 13.

Figure 14:
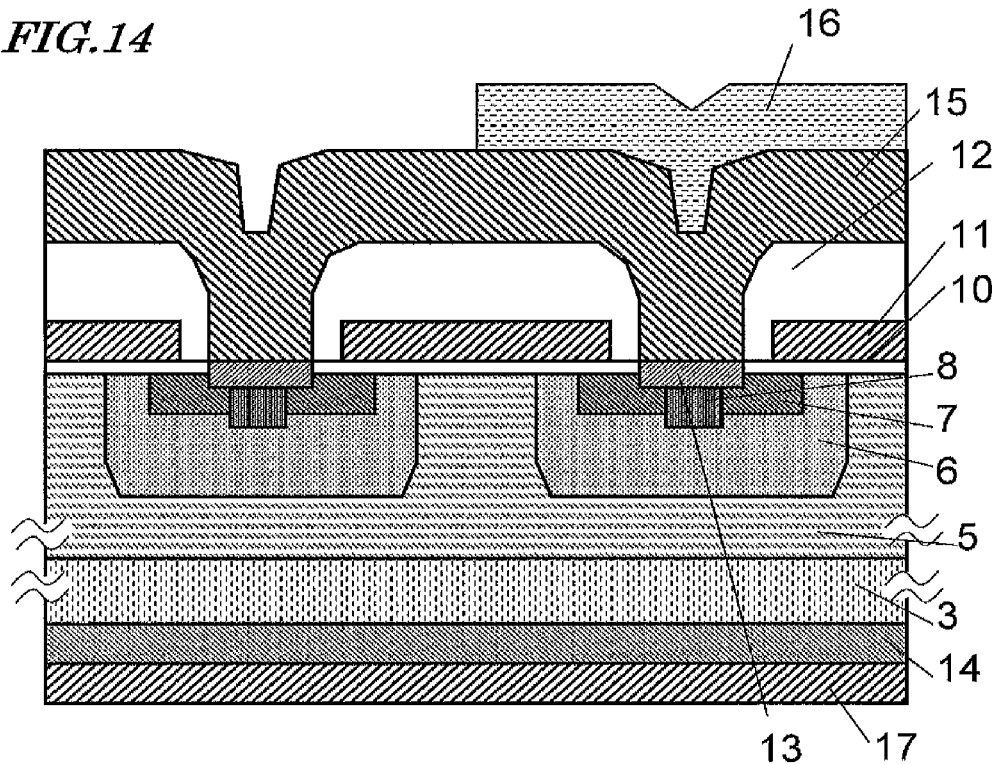
FIG. 14 is a sectional view illustrating a modification example of a DMISFET of FIG. 4.

The semiconductor element of this embodiment may have the following structure:

FIG. 14 is a sectional view illustrating a modification example of the DMISFET of FIG. 4. The channel epi layer 9 of FIG. 4 is not formed in the semiconductor device of FIG. 14. The rest of FIG. 14 is the same as in FIG. 4 and a description thereof is omitted.

Figure 15:
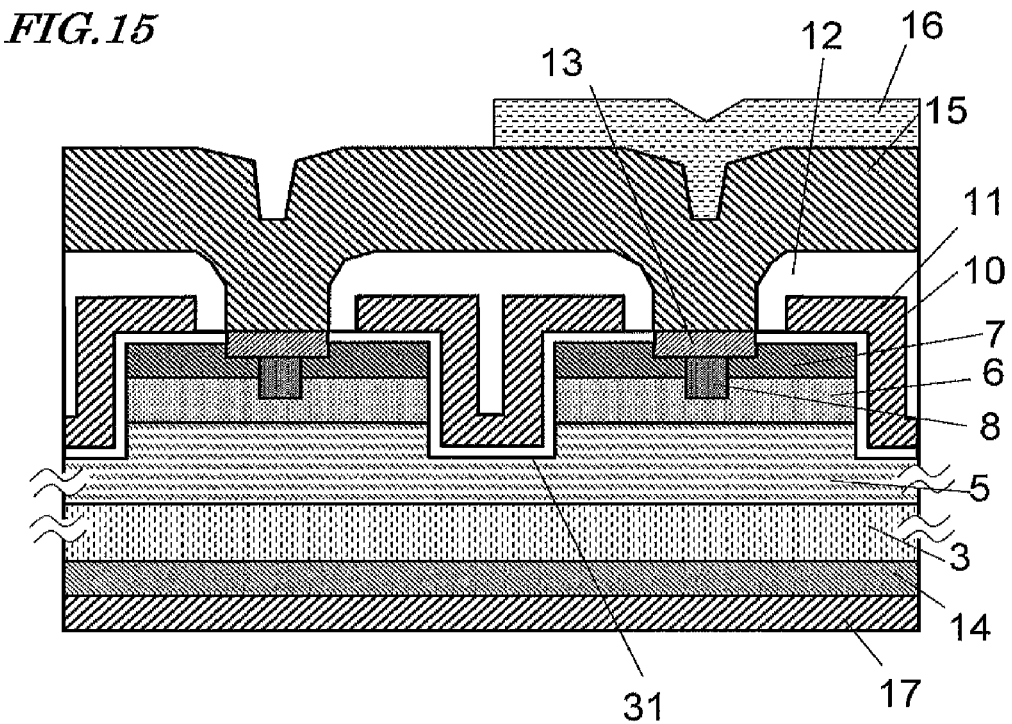
FIG. 15 is a sectional view illustrating a modification example of a trench MISFET of FIG. 13.

FIG. 15 is a sectional view illustrating a modification example of the trench MISFET of FIG. 13. The channel epi layer 9 of FIG. 13 is not formed in the semiconductor device of FIG. 15. The rest of FIG. 15 is the same as in FIG. 13 and a description thereof is omitted.

Figure 16:
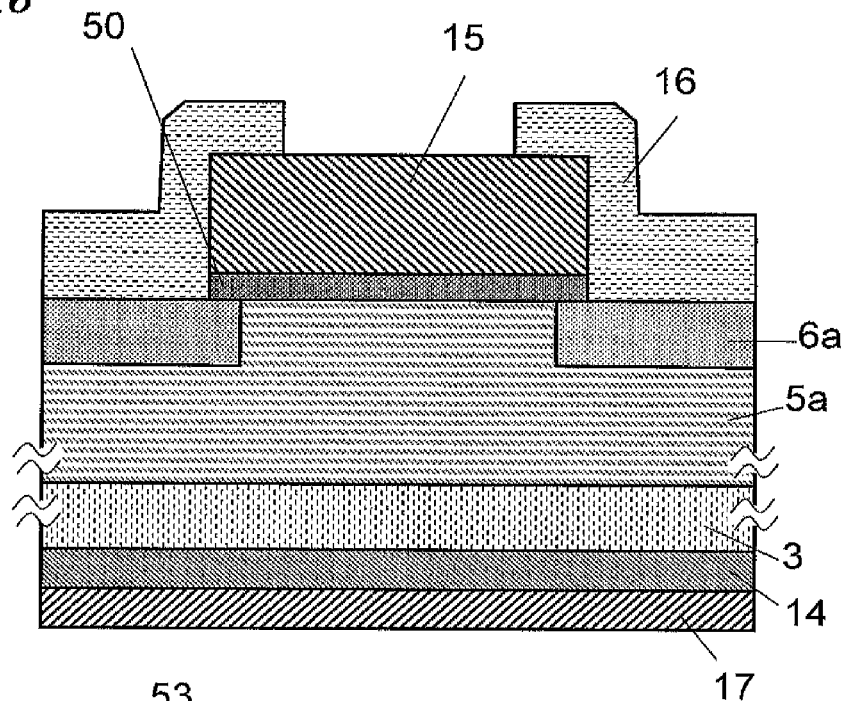
FIG. 16 is a sectional view illustrating the structure of a Schottky barrier diode.

FIG. 16 is a sectional view illustrating the structure of a Schottky barrier diode. In the Schottky barrier diode of FIG. 16, an $n^-$ layer 5a is disposed on the $n^+$-type silicon carbide substrate 3. A p-type region (or a high resistance region) 6a which functions as a guard ring is formed in a surface layer of the $n^-$ layer 5a. The p-type region 6a viewed from a direction perpendicular to the silicon carbide substrate 3 is disposed so as to surround the $n^-$ layer 5a. A Schottky electrode 50 is formed on a region of the surface layer of the $n^-$ layer 5a that is surrounded by the p-type region 6a. The $n^-$ layer 5a and the Schottky electrode 50 form a Schottky junction. The Schottky electrode 50 viewed from a direction perpendicular to the silicon carbide substrate 3 partially overlaps with the p-type region 6a. The pad electrode 15 is formed on the Schottky electrode 50. The pad electrode 15 is covered with the protective insulating film 16.

Figure 17:
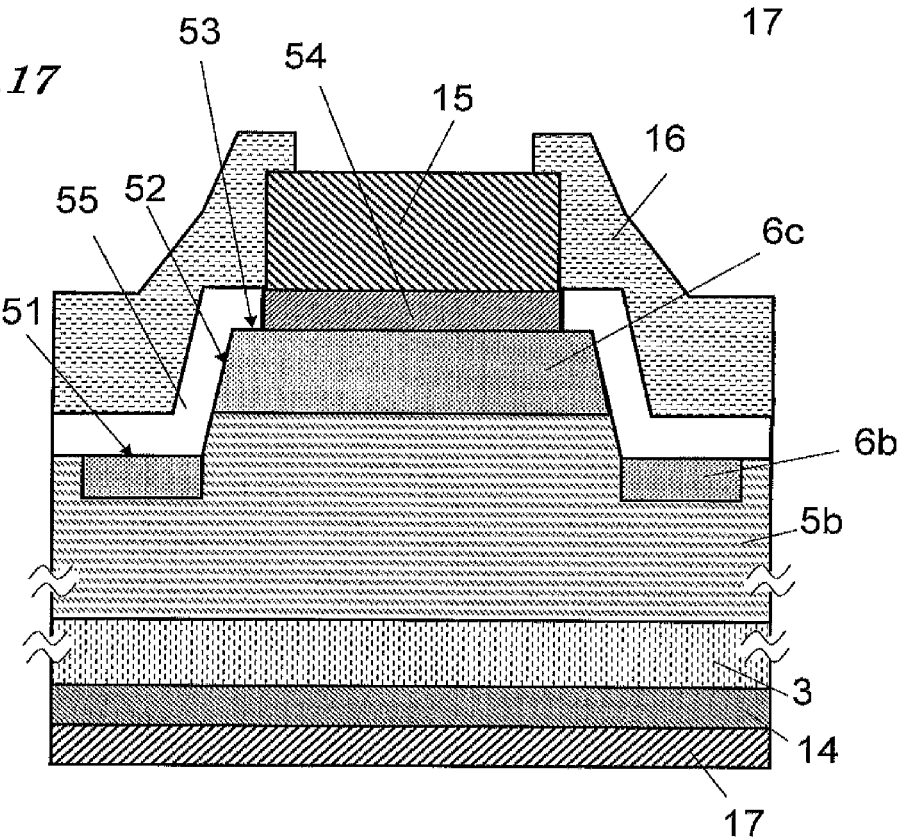
FIG. 17 is a sectional view illustrating the structure of a p-n junction diode.

FIG. 17 is a sectional view illustrating the structure of a p-n junction diode. The p-n junction diode of FIG. 17 has, for example, a mesa structure. An n layer 5b is provided on the $n^+$-type silicon carbide substrate 3. A part of the $n^-$ layer 5b is removed by dry etching or the like as a termination region 51, and a level difference 52 is formed on the top face of the $n^-$ layer 5b. The level difference 52 constitutes the "mesa structure".

In an element region 53, a p-type region 6c is formed in the surface layer of the $n^-$ layer 5b. The $n^-$ layer 5b and the p-type region 6c form a p-n junction and determine the breakdown voltage structure of the p-n junction diode. A p-type contact electrode 54 is formed on the p-type region 6c. The pad electrode 15 is formed on the p-type contact electrode 54.

In the termination region 51, a p-type guard ring region 6b is formed in the surface layer of the $n^-$ layer 5b. An oxide film 55 is formed on side faces of the level difference 52 and on the p-type guard ring region 6b. The protective insulating film 16 is formed on the oxide film 55.

The wiring electrode described herein is mainly an aluminum electrode, but any low-resistant metal, for example, copper or an alloy of copper, may be used instead.

This embodiment can be used for other termination structures such as a RESURF structure. This embodiment can also be applied favorably to other semiconductor elements such as an insulated gate bipolar transistor (IGBT), a metal-semiconductor field effect transistor (MESFET), a junction field effect transistor (JFET), and a bipolar transistor. In addition, this embodiment is favorably applicable to other hexagonal semiconductor materials than SiC and GaN, and to semiconductor materials of other crystal structures that have anisotropic mechanical properties.

The semiconductor chip 21 of this embodiment may be sealed in resin to be connected to the outside via a wire, a bonding pad, or the like. An example thereof is described below.

Figure 18:
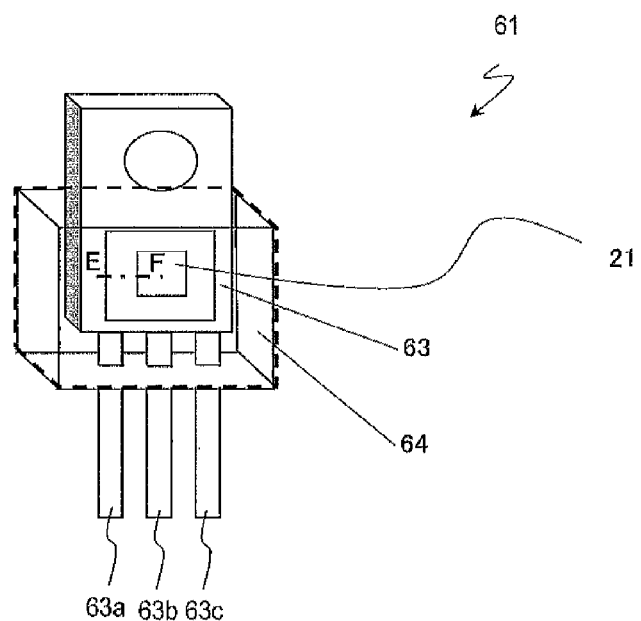
FIG. 18 is a perspective view illustrating a semiconductor device 61 which has the semiconductor chip 21 of the embodiment.
Figure 19:
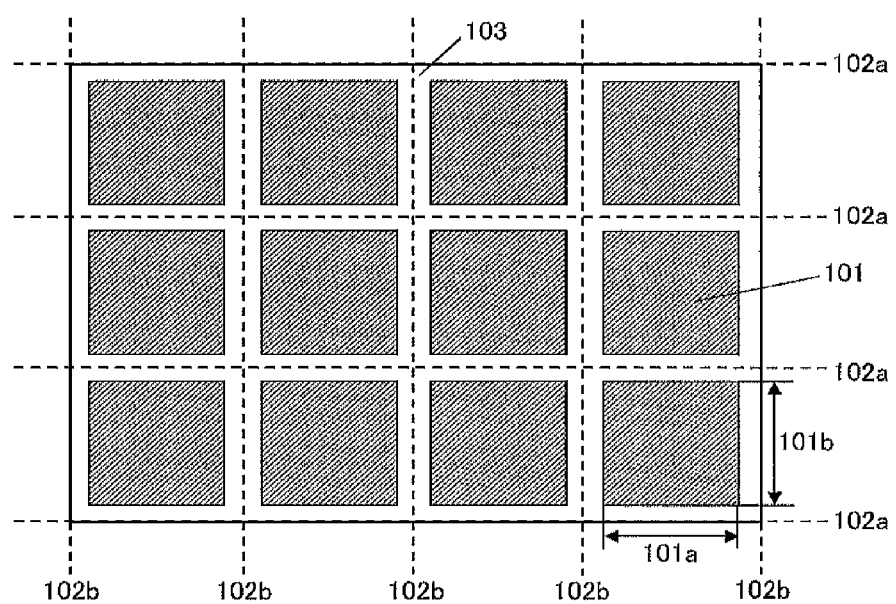
FIG. 19 is a plan view illustrating the structure of a conventional semiconductor device.
Figure 20:
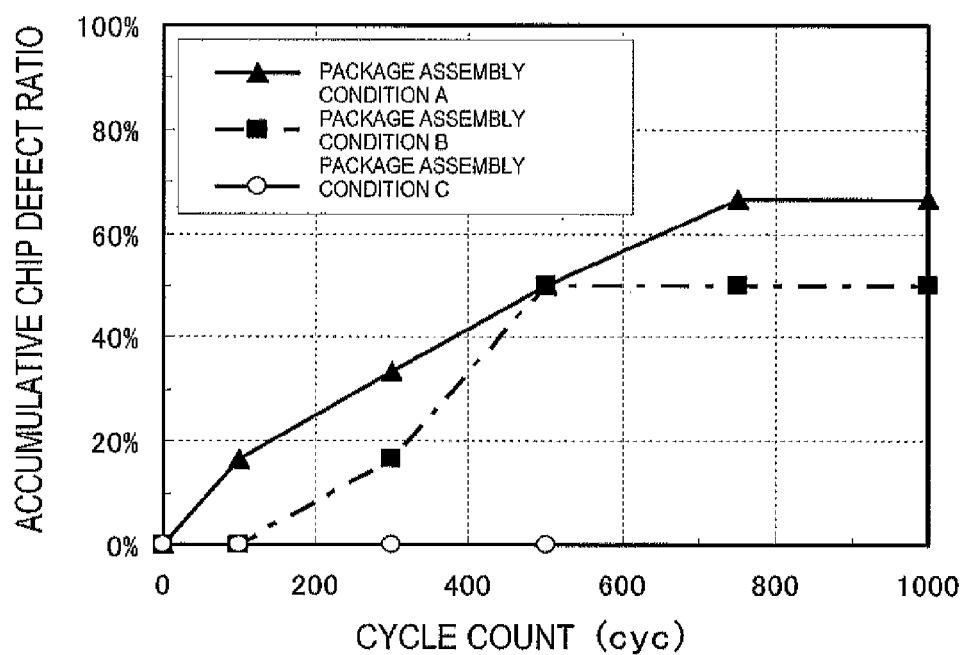
FIG. 20 is a graph showing results of a temperature cycle reliability test that uses 4H—SiC semiconductor chips.

FIG. 18 is a perspective view of a semiconductor device (a semiconductor package) 61 which has the semiconductor chip 21 of this embodiment. The semiconductor device 61 includes a supporting member 63, the semiconductor chip 21, sealing resin 64, and external terminals 63a, 63b, and 63c. The supporting member 63 is formed from a metal material such as an alloy containing copper, and supports the semiconductor chip 21. The external terminals 63a, 63b, and 63c, too, are formed from a metal material such as an alloy containing copper. The supporting member 63 and the external terminals 63a, 63b, and 63c are commonly called a lead frame.

The semiconductor chip 21 includes, as described below, a semiconductor element that has desired functions as a semiconductor device such as a MISFET, a p-n junction diode, or a Schottky barrier diode. FIG. 18, which illustrates a case where the semiconductor element included in the semiconductor chip 21 is a transistor, includes the three external terminals 63a, 63b, and 63c. In the case where the semiconductor element is a diode, two external terminals are included. The number of the external terminals provided may be four or more.

As illustrated in FIG. 18, the sealing resin 64 covers at least a part of the supporting member 63 and the entirety of the semiconductor chip 21 which is supported by the supporting member 63. The sealing resin 64 may cover the entire supporting member 63 as well as the entire semiconductor chip 21. The sealing resin 64 is formed from a known sealing resin material that is used in a semiconductor package, such as epoxy resin. JCR may be provided between the semiconductor chip 21 supported by the supporting member 63 and the sealing resin 64.

When a semiconductor chip is housed inside a semiconductor package as illustrated in FIG. 18, the amount of thermal deformation of the semiconductor chip can be measured after removing the resin with which the semiconductor chip is sealed and detaching the semiconductor chip from the lead frame. The thermal deformation amount of the semiconductor chip can be obtained by measuring with a DIC camera the amount of deformation of the semiconductor chip that is observed when, for example, the temperature is changed from room temperature (25° C.) to 150° C.±5° C.

INDUSTRIAL APPLICABILITY

The present invention is favorably used in various semiconductor devices that have anisotropic mechanical properties. The present invention is used particularly favorably in a diode or a transistor that uses a substrate made of SiC or GaN which is a hexagonal semiconductor.

REFERENCE SIGNS LIST 1 semiconductor device
1a, 1b first side, second side
1A, 1B first side, second side
2a, 2b cutting line
3a semiconductor wafer
20 cutting margin area
20a cutting margin remainder
21 semiconductor chip
3 silicon carbide substrate
4 buffer layer
5 drift epi layer
6 body region
7 source region
8 contact region
9 channel epi layer
10 gate insulating film
11 gate electrode
12 interlayer insulating film
13 source ohmic electrode
14 drain ohmic electrode
15 pad electrode
16 passivation insulating film
17 rear electrode
18 DMISFET region
19 guard ring (FLR) region
30 rotation angle with respect to the <11-20> direction
31 trench
50 Schottky electrode
51 termination region
52 level difference
53 element region
54 p-type contact electrode
55 oxide film
61 semiconductor device
63 lead frame
63a, 63b, 63c external terminal
64 sealing resin

The invention claimed is:

1. A semiconductor chip, comprising a hexagonal semiconductor layer,
wherein, when viewed from a direction perpendicular to the semiconductor layer, the semiconductor layer has a quadrangle shape which comprises a first side and a second side substantially orthogonal to the first side and different from the first side in linear expansion coefficient, and
wherein an amount of thermal deformation in a direction in which the first side extends and an amount of thermal deformation in a direction in which the second side extends are substantially equal to each other.

2. A semiconductor chip according to claim 1, further comprising an insulating film which is provided so as to cover at least a part of a principal surface of the semiconductor layer and which has an isotropic mechanical property.

3. A semiconductor chip according to claim 1, further comprising a metal film which has an isotropic mechanical property.

4. A semiconductor chip according to claim 3, wherein the metal film comprises aluminum, copper, or an alloy of aluminum or copper.

5. A semiconductor chip according to claim 1, wherein the semiconductor layer comprises silicon carbide.

6. A semiconductor chip according to claim 1, wherein the semiconductor layer comprises gallium nitride.

7. A semiconductor chip according to claim 1, wherein the principal surface of the semiconductor layer is tilted from a (0001) plane by −10° or more and 10° or less.

8. A semiconductor chip according to claim 1, wherein the semiconductor layer is a layer formed, on a principal surface of a single-crystal substrate, from the same material as a material of the single-crystal substrate.

9. A semiconductor chip according to claim 1, wherein the following expression is established:

$$0.8 \leq \Delta Lx/\Delta Ly \leq 1.2,$$

where Lx represents a length of the first side, Ly represents a length of the second side, $\Delta Lx$ represents a thermal deformation amount along the direction in which the first side extends, and $\Delta Ly$ represents a thermal deformation amount along the direction in which the second side extends.

10. A semiconductor chip according to claim 1, wherein the direction in which the first side extends and a <11-20> direction form an angle that is less than 15°, and the first side is longer than the second side.

11. A semiconductor chip according to claim 1, wherein a linear expansion coefficient along the direction in which the first side extends is smaller than a linear expansion coefficient along the direction in which the second side extends, and the first side is longer than the second side.

12. A semiconductor chip according to claim 10, wherein the following expression is established:

$$1.05 \leq Lx/Ly \leq 1.6,$$

where Lx represents a length of the first side and Ly represents a length of the second side.

13. A semiconductor chip according to claim 10,
wherein the semiconductor layer comprises silicon carbide, and
wherein the following expression is established:

$$1.1 \leq Lx/Ly \leq 1.6,$$

where Lx represents a length of the first side and Ly represents a length of the second side.

14. A semiconductor chip according to claim 10,
wherein the semiconductor layer comprises gallium nitride, and
wherein the following expression is established:

$$1.05 \leq Lx/Ly \leq 1.2,$$

where Lx represents a length of the first side and Ly represents a length of the second side.

15. A semiconductor chip according to claim 2, wherein the insulating film is formed from an insulator comprising silicon nitride.

16. A semiconductor chip according to claim 2, wherein the insulating film has a thickness of 1.5 µm or more and 5 µm or less.

17. A semiconductor chip according to claim 1, wherein the semiconductor layer is a part of a p-n junction diode.

18. A semiconductor device comprising:
the semiconductor chip of claim 1; and
a resin which covers at least a part of the semiconductor chip.

19. A method of manufacturing a semiconductor chip comprising a hexagonal semiconductor layer,
the method comprising:
a step (a) of forming a semiconductor device on a wafer that contains the semiconductor layer; and
a step (b) of forming the semiconductor chip comprising the semiconductor device by cutting the wafer in a first direction and a second direction,
wherein the step (b) comprises determining a length of the semiconductor chip along the first direction and a length of the semiconductor chip along the second direction so that an amount of thermal deformation along the first direction of the semiconductor chip-becomes substantially equal to an amount of thermal deformation along the second direction of the semiconductor chip.

20. A semiconductor chip according to claim 1, wherein the semiconductor layer is a part of a Schottky barrier diode.

21. A semiconductor chip according to claim 1, wherein the semiconductor layer is a part of a metal-insulator-semiconductor field effect transistor.

22. A semiconductor chip according to claim 1, wherein the semiconductor layer is a part of a metal-semiconductor field effect transistor.

23. A semiconductor chip according to claim 1, wherein the semiconductor layer is a part of a junction field effect transistor.

24. A semiconductor chip according to claim 2, wherein the insulating film includes a gate insulating film, an interlayer insulating film and a protective insulating film,
the gate insulating film being provided on the semiconductor layer,
wherein the semiconductor chip further comprises:
a gate electrode provided between the gate insulating film and the interlayer insulating film; and
a pad electrode provided between the interlayer insulating film and the protective insulating film.

25. A semiconductor chip according to claim 24, wherein the interlayer insulating film is formed from silicon oxide.

26. A semiconductor chip according to claim 24, wherein the protective insulating film is formed from silicon nitride.

27. A semiconductor chip according to claim 24, wherein the pad electrode is formed from aluminum or aluminum alloy.

* * * * *